(12) United States Patent
Tamura et al.

(10) Patent No.: US 8,067,250 B2
(45) Date of Patent: Nov. 29, 2011

(54) FERROELECTRIC MEMORY DEVICE AND METHOD OF MANUFACTURING THE SAME

(75) Inventors: Hiroaki Tamura, Kuwana (JP); Teruo Tagawa, Suwa (JP)

(73) Assignee: Seiko Epson Corporation (JP)

( * ) Notice: Subject to any disclaimer, the term of this patent is extended or adjusted under 35 U.S.C. 154(b) by 632 days.

(21) Appl. No.: 12/069,799

(22) Filed: Feb. 13, 2008

(65) Prior Publication Data

US 2008/0213924 A1   Sep. 4, 2008

Related U.S. Application Data

(62) Division of application No. 11/088,236, filed on Mar. 23, 2005, now abandoned.

(30) Foreign Application Priority Data

Mar. 24, 2004 (JP) ................................ 2004-087622
Jan. 12, 2005 (JP) ................................ 2005-005341

(51) Int. Cl.
*H01L 21/00* (2006.01)
*H01L 21/8242* (2006.01)

(52) U.S. Cl. ............................ 438/3; 438/253

(58) Field of Classification Search .......... 438/239–256, 438/396–399, E27.086
See application file for complete search history.

(56) References Cited

U.S. PATENT DOCUMENTS

| | | | |
|---|---|---|---|
| 6,249,014 B1 | 6/2001 | Bailey | |
| 6,469,333 B1 | 10/2002 | Takai et al. | |
| 6,611,014 B1 | 8/2003 | Kanaya et al. | |
| 6,635,528 B2 | 10/2003 | Gilbert et al. | |
| 6,982,448 B2 | 1/2006 | Udayakumar et al. | |
| 6,982,453 B2 | 1/2006 | Kanaya et al. | |
| 2002/0127867 A1* | 9/2002 | Lee | 438/694 |
| 2003/0089954 A1 | 5/2003 | Sushida | |
| 2003/0124748 A1 | 7/2003 | Summerfelt et al. | |
| 2004/0159874 A1* | 8/2004 | Tsuchiya et al. | 438/627 |
| 2007/0163488 A1* | 7/2007 | Tois et al. | 117/88 |

FOREIGN PATENT DOCUMENTS

| | | |
|---|---|---|
| JP | 10-287494 | 10/1998 |
| JP | 2001-053244 | 2/2001 |
| JP | 2001-223342 | 8/2001 |
| JP | 2002-280528 | 9/2002 |
| JP | 2003-051582 | 2/2003 |
| JP | 2003-332534 | 11/2003 |
| JP | 2004-039816 | 2/2004 |

OTHER PUBLICATIONS

Patent Abstracts of Japan for JP 2001-044375.

* cited by examiner

*Primary Examiner* — Cuong Q Nguyen
(74) *Attorney, Agent, or Firm* — Harness, Dickey & Pierce, P.L.C.

(57) ABSTRACT

A method of manufacturing a ferroelectric memory device includes: forming a hydrogen barrier film which covers a ferroelectric capacitor including a lower electrode, a ferroelectric film, and an upper electrode, wherein a thickness of an area of the hydrogen barrier film provided on the upper electrode is made greater than a thickness of an area of the hydrogen barrier film provided on a sidewall of the ferroelectric capacitor by forming the area of the hydrogen barrier film provided on the upper electrode in a plurality of layers.

4 Claims, 44 Drawing Sheets

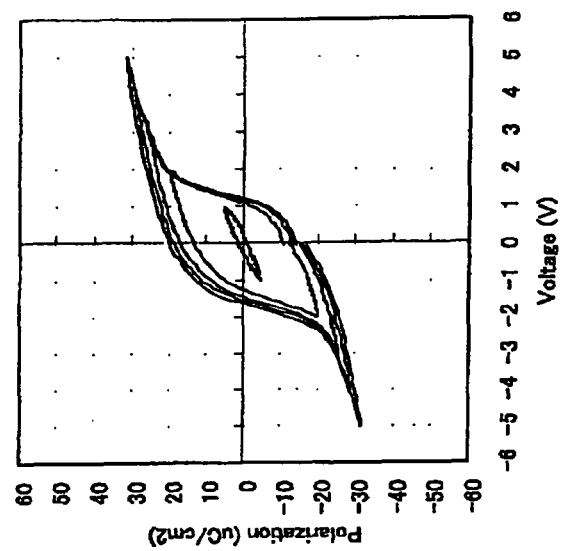
FIG. 12A  1um
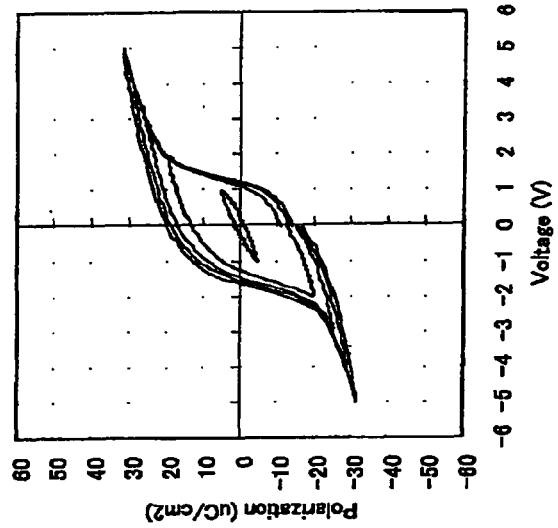
FIG. 12B  10um
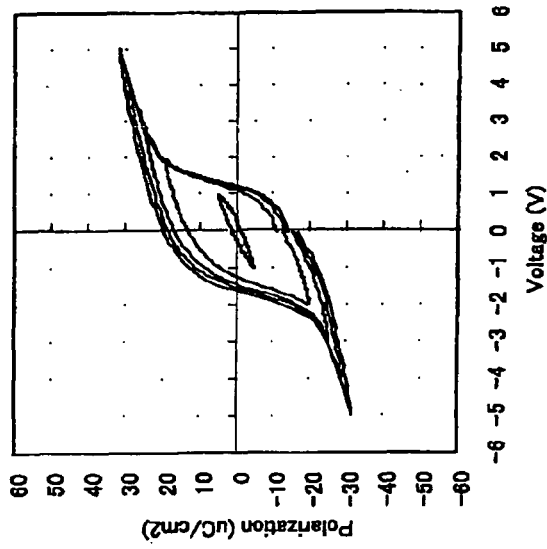
FIG. 12C  100um

FERROELECTRIC MEMORY DEVICE AND METHOD OF MANUFACTURING THE SAME

This application is a divisional of U.S. patent application Ser. No. 11/088,236 filed Mar. 23, 2005. This application claims the benefit of Japanese Patent Application No. 2004-087622, filed on Mar. 24, 2004, and Japanese Patent Application No. 2005-005341, filed on Jan. 12, 2005. The disclosures of the above applications are incorporated herein by reference.

BACKGROUND OF THE INVENTION

The present invention relates to a ferroelectric memory device and a method of manufacturing the same.

A nonvolatile memory device using spontaneous polarization specific to a ferroelectric (ferroelectric memory device) has attracted attention as an ultimate memory having the possibility of replacing not only a conventional nonvolatile memory but also most memories such as a static RAM (SRAM) and a DRAM due to its characteristics such as a high-speed write/read and low-voltage operation. As the ferroelectric material, a number of candidate materials have been proposed. In particular, a perovskite-type oxide such as lead zirconate titanate ($Pb(Zr,Ti)O_3$, hereinafter abbreviated as "PZT") and a bismuth-layered compound such as $SrBi_2Ta_2O_9$ are considered to be promising materials due to their extremely excellent ferroelectric characteristics.

In general, when using the above-mentioned oxide material as a capacitor insulating layer, an interlayer dielectric such as $SiO_2$ is deposited after forming an upper electrode in order to provide electrical insulation between each memory element as the major objective. As the deposition method, a chemical vapor deposition (CVD) method excelling in step coverage is generally used. However, use of such a deposition method causes hydrogen to be generated as a reaction by-product. In particular, if activated hydrogen passes through $SiO_2$ and the upper electrode and reaches the ferroelectric thin film, the crystallinity of the ferroelectric is impaired due to the reducing effect of hydrogen, whereby the electrical characteristics deteriorate to a considerable extent. The characteristics of a MOS transistor as a switching element deteriorate due to lattice defects occurring in the silicon single crystal during the device manufacturing step. Therefore, it is necessary to subject the MOS transistor to a heat treatment in a hydrogen-containing nitrogen gas in the final stage. However, since the hydrogen concentration in this step is higher than that during formation of the interlayer dielectric, damage occurring to the ferroelectric thin film is more acute.

In order to prevent the reduction and deterioration of the ferroelectric capacitor due to hydrogen, a method of depositing a protective film after forming a ferroelectric thin-film capacitor so as to cover the ferroelectric thin-film capacitor to prevent entrance of hydrogen has been attempted. This protective film is generally called a hydrogen barrier film. Since the ferroelectric capacitor is isolated from the hydrogen atmosphere during formation of the interlayer dielectric due to the presence of the protective film, deterioration of the electrical characteristics from the initial value can be prevented.

The hydrogen barrier film is generally deposited after forming the ferroelectric capacitor so as to cover the ferroelectric capacitor. This enables the ferroelectric capacitor to be isolated from hydrogen generated in the subsequent step. However, if the ferroelectric capacitor is covered with the hydrogen barrier, elements other than hydrogen are also intercepted. For example, oxygen is not supplied to the ferroelectric even if the substrate is heated in an oxygen atmosphere, since the hydrogen barrier film also functions as an oxygen barrier film. Specifically, once the ferroelectric capacitor is covered with the hydrogen barrier film, it is extremely difficult to recover the crystallinity of the ferroelectric to secure the electrical characteristics of the capacitor. In the stage in which the hydrogen barrier film is applied, it is indispensable that the ferroelectric capacitor maintain desired characteristics. However, damage to the ferroelectric often occurs during formation of the ferroelectric capacitor. In general, processing using dry etching is employed for forming the capacitor, and the resist must be removed after completion of the objective etching. As the removal method, a method of burning the resist by exposure to $O_2$ plasma or $N_2$ plasma can be given. However, if hydrogen generated during the resist combustion process, a water molecule, or a reducing etching gas passes through the upper electrode and reaches the interface between the upper electrode and the ferroelectric, the ferroelectric is reduced in this region, whereby the crystallinity is impaired to a considerable extent. Since such damage cannot be sufficiently corrected by subsequent heating and is more sensitive to the reducing atmosphere in the subsequent step, the crystallinity is easily disordered. Therefore, a damaged region which cannot contribute to polarization switching occurs.

If the hydrogen barrier film having a tensile stress is provided on the ferroelectric capacitor, the loss of polarization electric charge of the ferroelectric is increased on the sidewall of the capacitor. In particular, a minute capacitor cannot exhibit sufficient characteristics.

BRIEF SUMMARY OF THE INVENTION

A first aspect of the present invention relates to a ferroelectric memory device, including:

a substrate;

a ferroelectric capacitor which is formed on the substrate and includes a lower electrode, a ferroelectric film, and an upper electrode;

a hydrogen barrier film provided to cover the ferroelectric capacitor; and an interlayer dielectric provided on the hydrogen barrier film, wherein a thickness of an area of the hydrogen barrier film provided on the upper electrode is greater than a thickness of an area of the hydrogen barrier film provided on a sidewall of the ferroelectric capacitor.

A second aspect of the present invention relates to a method of manufacturing a ferroelectric memory device, the method including:

forming a hydrogen barrier film which covers a ferroelectric capacitor including a lower electrode, a ferroelectric film, and an upper electrode, wherein a thickness of an area of the hydrogen barrier film provided on the upper electrode is made greater than a thickness of an area of the hydrogen barrier film provided on a sidewall of the ferroelectric capacitor by forming the area of the hydrogen barrier film provided on the upper electrode in a plurality of layers.

A third aspect of the present invention relates to a method of manufacturing a ferroelectric memory device, the method including:

(a) forming a lower electrode, a ferroelectric film, and an upper electrode on a substrate in layers in that order;

(b) forming a first hydrogen barrier film on the upper electrode;

(c) patterning the first hydrogen barrier film, the upper electrode, the ferroelectric film, and the lower electrode to form a ferroelectric capacitor; and (d) forming a second hydrogen barrier film which covers the ferroelectric capacitor.

A fourth aspect of the present invention relates to a method of manufacturing a ferroelectric memory device, the method including:

(a) forming a lower electrode, a ferroelectric film, and an upper electrode on a substrate in layers in that order;

(b) patterning the upper electrode;

(c) forming a first hydrogen barrier film on the upper electrode and the ferroelectric film;

(d) patterning the first hydrogen barrier film, the ferroelectric film, and the lower electrode to have an area greater than an area of the upper electrode to form a ferroelectric capacitor; and (e) forming a second hydrogen barrier film which covers the ferroelectric capacitor.

A fifth aspect of the present invention relates to a method of manufacturing a ferroelectric memory device, the method including:

(a) forming a lower electrode, a ferroelectric film, and an upper electrode on a substrate in layers in that order;

(b) forming a first hydrogen barrier film on the upper electrode;

(c) patterning the first hydrogen barrier film and the upper electrode;

(d) forming a second hydrogen barrier film on the first hydrogen barrier film and the ferroelectric film;

(e) patterning the second hydrogen barrier film, the ferroelectric film, and the lower electrode to have an area greater than an area of the upper electrode to form a ferroelectric capacitor; and (f) forming a third hydrogen barrier film which covers the ferroelectric capacitor.

BRIEF DESCRIPTION OF THE SEVERAL VIEWS OF THE DRAWING

FIGS. 12A to 12C are graphs showing the hysteresis loop of a sample 1 according to Example 1.

DETAILED DESCRIPTION OF THE EMBODIMENT

Figure 1:
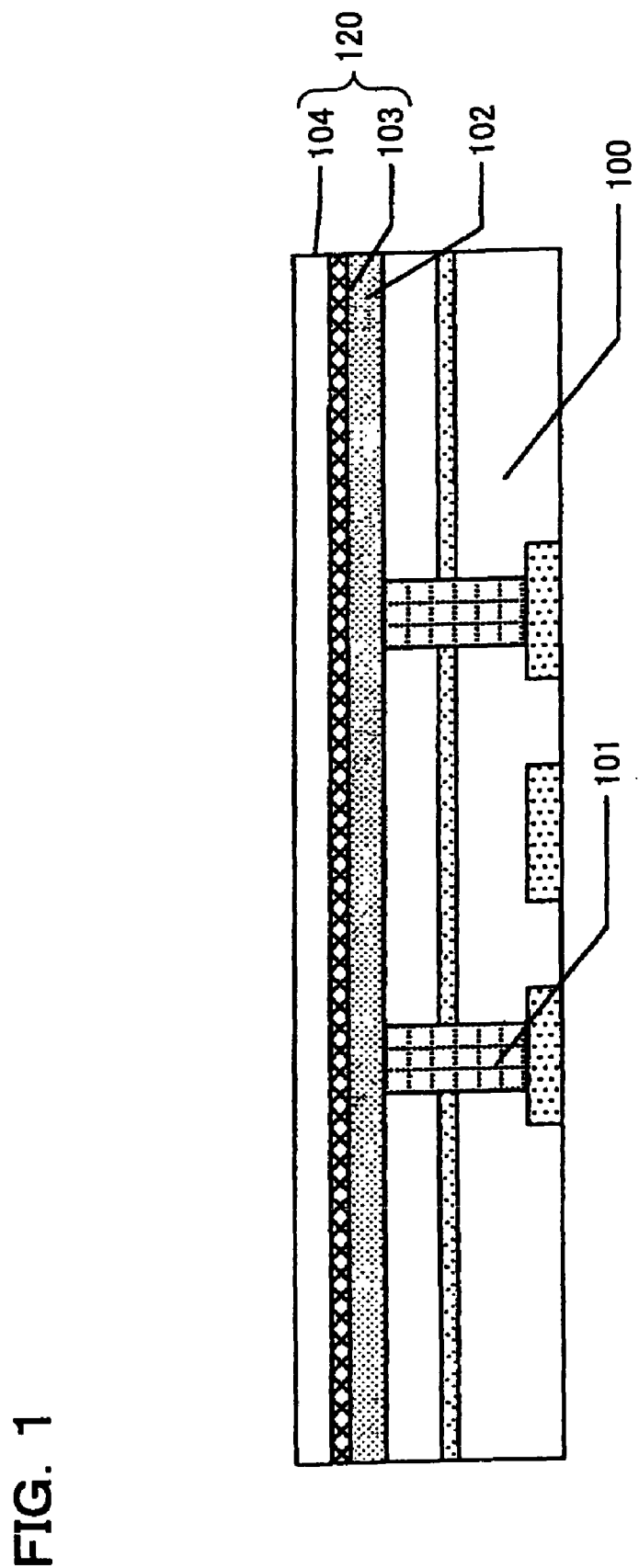
FIG. 1 shows a method of manufacturing a ferroelectric memory device according to a first embodiment.

A ferroelectric memory device of the present invention may provide a structure which can prevent damage occurring at the interface between an upper electrode and a ferroelectric during capacitor formation, and can prevent deterioration of ferroelectric characteristics due to the stress of a hydrogen barrier film. A method of manufacturing a ferroelectric memory device of the present invention can prevent damage occurring at the interface between an upper electrode and a ferroelectric during capacitor formation.

(1) In one embodiment of the present invention, a ferroelectric memory device includes:

a substrate;

a ferroelectric capacitor which is formed on the substrate and includes a lower electrode, a ferroelectric film, and an upper electrode;

a hydrogen barrier film provided to cover the ferroelectric capacitor; and an interlayer dielectric provided on the hydrogen barrier film, wherein a thickness of an area of the hydrogen barrier film provided on the upper electrode is greater than a thickness of an area of the hydrogen barrier film provided on a sidewall of the ferroelectric capacitor.

According to this embodiment, reducing elements (hydrogen, for example) can be prevented from entering the ferroelectric capacitor, and sufficient ferroelectric characteristics can be obtained even if the size of the ferroelectric capacitor is reduced.

In this embodiment, the statement "a layer B is provided on a specific layer A" includes the case where the layer B is directly provided on the layer A and the case where the layer B is provided on the layer A through another layer. This also applies to the following embodiments.

(2) With this ferroelectric memory device, an area of an upper surface of the ferroelectric film may be greater than an area of an interface between the ferroelectric film and the upper electrode.

According to this feature, damage occurring on the sidewall of the ferroelectric film when patterning the ferroelectric film does not affect the ferroelectric characteristics of the ferroelectric capacitor, whereby excellent ferroelectric characteristics can be obtained.

(3) With this ferroelectric memory device, the hydrogen barrier film may include:

a first hydrogen barrier film provided on the upper electrode; and a second hydrogen barrier film provided on the first hydrogen barrier film and in a region including the sidewall of the ferroelectric capacitor.

(4) With this ferroelectric memory device, the hydrogen barrier film may include:

a first hydrogen barrier film provided on the upper electrode;

a second hydrogen barrier film provided on the first hydrogen barrier film and the ferroelectric film; and a third hydrogen barrier film provided on the second hydrogen barrier film and in a region including the sidewall of the ferroelectric capacitor.

(5) With this ferroelectric memory device, the hydrogen barrier film may be formed by using an atomic-layer CVD (ALCVD) method.

According to this feature, the density of the hydrogen barrier film can be increased, whereby a more excellent hydrogen barrier function can be obtained.

(6) With this ferroelectric memory device, the hydrogen barrier film may be an oxide including one or more elements selected from aluminum, titanium, hafnium, zirconium, magnesium, and tantalum.

According to this feature, since these elements exhibit an excellent hydrogen barrier function, the thickness of the hydrogen barrier film can be reduced.

(7) In another embodiment of the present invention, a method of manufacturing a ferroelectric memory device includes:

forming a hydrogen barrier film which covers a ferroelectric capacitor including a lower electrode, a ferroelectric film, and an upper electrode, wherein a thickness of an area of the hydrogen barrier film provided on the upper electrode is made greater than a thickness of an area of the hydrogen barrier film provided on a sidewall of the ferroelectric capacitor by forming the area of the hydrogen barrier film provided on the upper electrode in a plurality of layers.

According to this embodiment, reducing elements (hydrogen, for example) can be prevented from entering the ferroelectric capacitor, and sufficient ferroelectric characteristics can be obtained even if the size of the ferroelectric capacitor is reduced.

(8) In a further embodiment of the present invention, a method of manufacturing a ferroelectric memory device includes:

(a) forming a lower electrode, a ferroelectric film, and an upper electrode on a substrate in layers in that order;

(b) forming a first hydrogen barrier film on the upper electrode;

(c) patterning the first hydrogen barrier film, the upper electrode, the ferroelectric film, and the lower electrode to form a ferroelectric capacitor; and (d) forming a second hydrogen barrier film which covers the ferroelectric capacitor.

According to this embodiment, the first hydrogen barrier film formed in advance on the upper electrode protects the ferroelectric film from reducing elements generated during a resist removal step after patterning of the upper electrode and the subsequent patterning necessary for capacitor formation.

(9) In a still further embodiment of the present invention, a method of manufacturing a ferroelectric memory device includes:

(a) forming a lower electrode, a ferroelectric film, and an upper electrode on a substrate in layers in that order;

(b) patterning the upper electrode;

(c) forming a first hydrogen barrier film on the upper electrode and the ferroelectric film;

(d) patterning the first hydrogen barrier film, the ferroelectric film, and the lower electrode to have an area greater than an area of the upper electrode to form a ferroelectric capacitor; and (e) forming a second hydrogen barrier film which covers the ferroelectric capacitor.

According to this embodiment, damage occurring on the sidewall of the ferroelectric film when patterning the ferroelectric film does not affect the ferroelectric characteristics of the ferroelectric capacitor, whereby excellent ferroelectric characteristics can be obtained.

(10) In a yet further embodiment of the present invention, a method of manufacturing a ferroelectric memory device includes:

(a) forming a lower electrode, a ferroelectric film, and an upper electrode on a substrate in layers in that order;

(b) forming a first hydrogen barrier film on the upper electrode;

(c) patterning the first hydrogen barrier film and the upper electrode;

(d) forming a second hydrogen barrier film on the first hydrogen barrier film and the ferroelectric film;

(e) patterning the second hydrogen barrier film, the ferroelectric film, and the lower electrode to have an area greater than an area of the upper electrode to form a ferroelectric capacitor; and (f) forming a third hydrogen barrier film which covers the ferroelectric capacitor.

According to this embodiment, the first hydrogen barrier film formed in advance on the upper electrode protects the ferroelectric film from reducing elements generated during a resist removal step after patterning of the upper electrode and the subsequent patterning necessary for capacitor formation.

Moreover, damage occurring on the sidewall of the ferroelectric film when patterning the ferroelectric film does not adversely affect the ferroelectric characteristics of the ferroelectric capacitor. Furthermore, formation of a damaged region at the interface between the lower electrode and the ferroelectric film due to etching can be prevented when patterning the lower electrode. Therefore, extremely excellent ferroelectric characteristics can be obtained.

(11) With any one of these methods of manufacturing a ferroelectric memory device, the first hydrogen barrier film may be formed by using the same method as the upper electrode.

This enables the first hydrogen barrier film to be continuously deposited after depositing the upper electrode without subjecting the upper electrode to the atmosphere, whereby molecules which function as the hydrogen source, such as moisture and organic molecules, can be prevented from being adsorbed on the surface of the upper electrode after depositing the upper electrode.

(12) With any one of these methods of manufacturing a ferroelectric memory device, at least one of the hydrogen barrier films may be formed by using a sputtering method.

(13) With any one of these methods of manufacturing a ferroelectric memory device, at least one of the hydrogen barrier films may be formed by using an atomic-layer CVD (ALCVD) method.

According to this feature, since the above method excels in step coverage characteristics of the hydrogen barrier film, entrance of reducing elements from the sidewall of the ferroelectric capacitor can be prevented, for example.

(14) With any one of these methods of manufacturing a ferroelectric memory device, ozone may be used as an oxidizing agent for a metal element to be supplied in the ALCVD method.

This enables the hydrogen barrier film to be formed without impairing the crystallinity of the ferroelectric film.

The embodiments of the present invention are described below with reference to the drawings.

First Embodiment

FIGS. 1 to 11 schematically show a method of manufacturing a ferroelectric memory device according to a first embodiment of the present invention.

(1) As shown in FIG. 1, a plug 101 is formed in a substrate 100, and a barrier metal layer 102 and a lower electrode 120 are formed on the plug 101.

A resist pattern for forming a contact hole is formed by a lithographic step on the substrate 100 on which a switching transistor is formed, and a contact hole is formed by using a dry etching method. After depositing a conductive film (tungsten film, for example) by using a chemical vapor deposition (CVD) method, the conductive film is ground by chemical mechanical polishing to form the plug (tungsten plug, for example) 101 in the contact hole. The substrate 100 includes a semiconductor substrate and an interlayer dielectric formed on the semiconductor substrate.

A titanium aluminum nitride (TiAlN) film is deposited as the barrier metal layer 102 by using a sputtering method in the region including the region positioned on the plug 101, for example. The lower electrode 120 is formed on the barrier metal layer 102. The barrier metal layer 102 lies between the plug 101 and the lower electrode 120. The lower electrode 120 may be formed of either a single layer or a plurality of layers. For example, the lower electrode 120 may be formed by stacking an iridium (Ir) thin film 103 and a platinum (Pt) film 104.

The lower electrode 120 may be formed by stacking at least one layer of a material such as Pt, Ir, Ir oxide ($IrO_x$), Ru, Ru oxide ($RuO_x$), and SrRu complex oxide ($SrRuO_x$). The material for the lower electrode 120 is not limited. As the formation method for the lower electrode 120, a sputtering method, a vacuum deposition method, a CVD method, and the like can be given.

Figure 2:
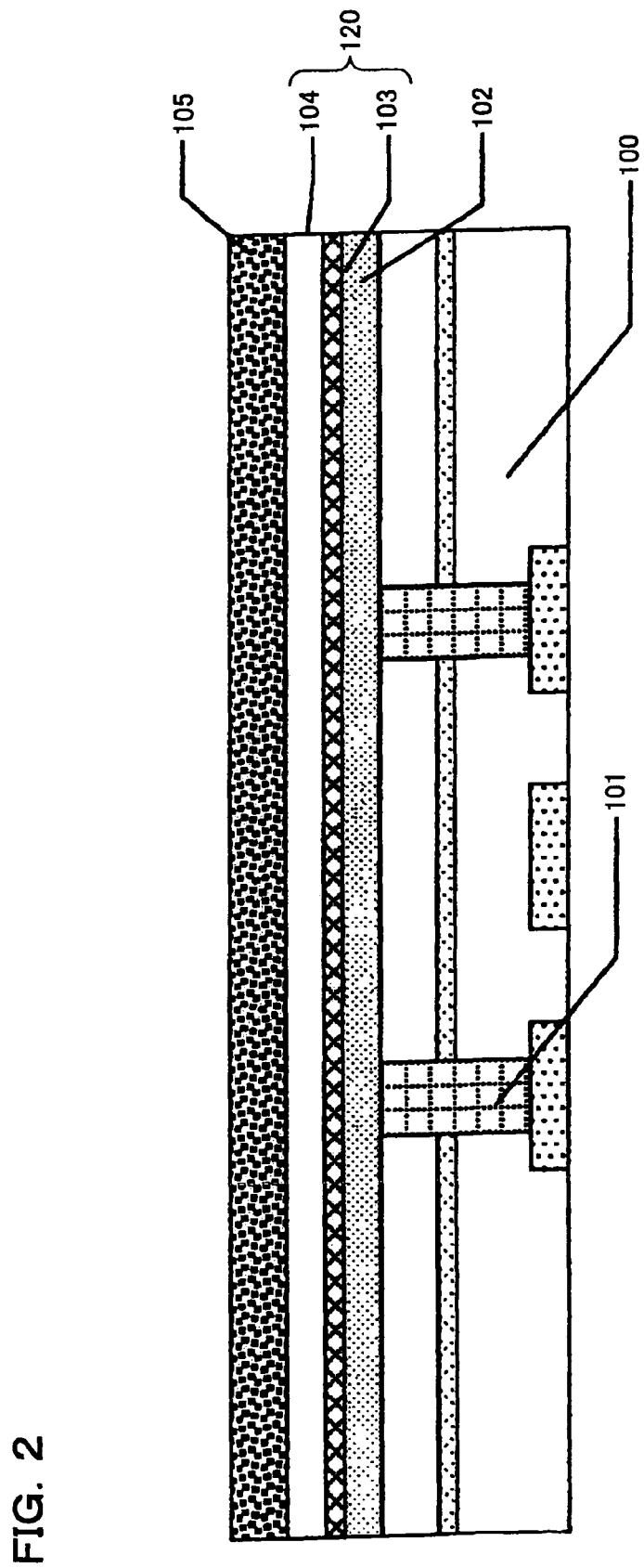
FIG. 2 shows the method of manufacturing the ferroelectric memory device according to the first embodiment.
Figure 3:
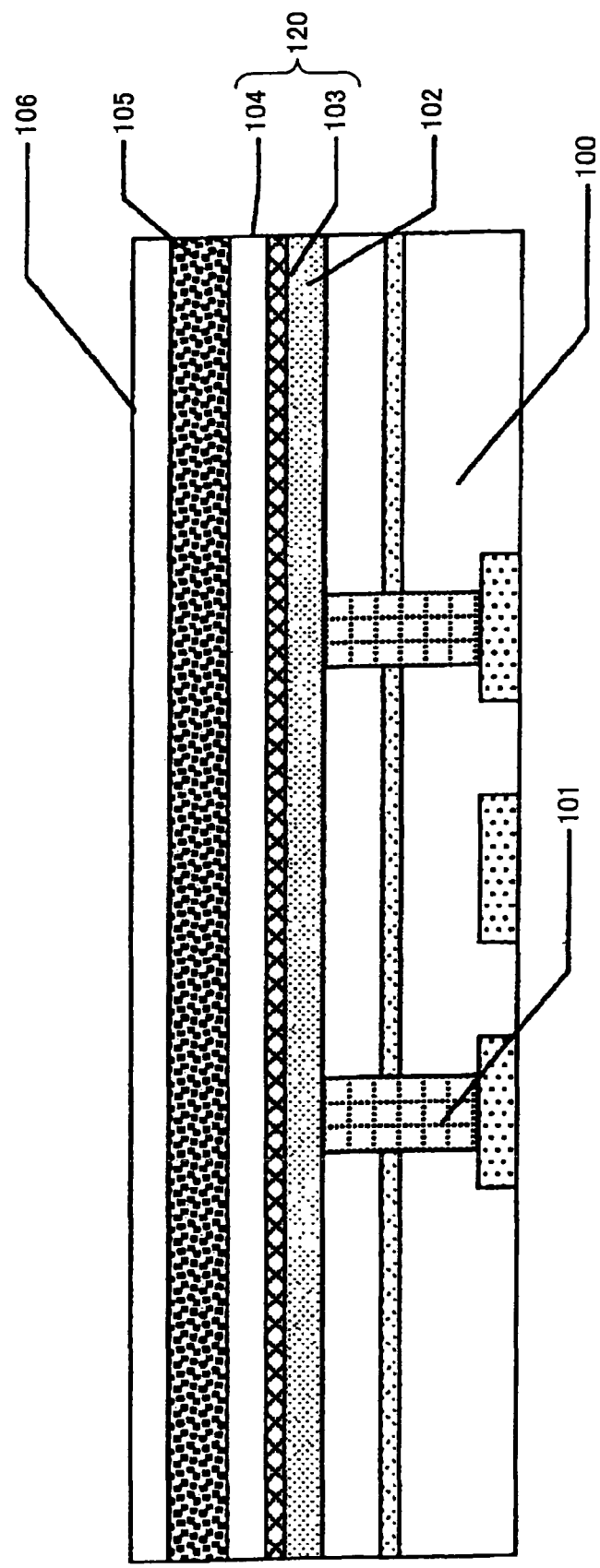
FIG. 3 shows the method of manufacturing the ferroelectric memory device according to the first embodiment.

(2) As shown in FIGS. 2 and 3, a ferroelectric film 105 and an upper electrode 106 are formed on the lower electrode 120.

An organic solution including lead, titanium, and zirconium is applied to the lower electrode 120 by using a spin coating method, and the applied solution is dried to obtain a precursor film. The spin coating step and the drying step are repeatedly performed until the thickness of the precursor film reaches a desired thickness. The precursor film is then subjected to an oxygen annealing treatment at 525° C. for five minutes to obtain the ferroelectric film ($Pb(Zr,Ti)O_3$) 105 which is a crystalline thin film. Then, platinum is deposited on the ferroelectric film 105 as the upper electrode 106 by using a sputtering method. The material and the formation method for the upper electrode 106 are the same as described for the lower electrode 120.

The material for the ferroelectric film 105 is not limited to the above-mentioned PZT material. Any of a PZTN material, SBT material, BST material, BIT material, and BLT material may be applied. As the formation method for the ferroelectric film 105, various methods such as a solution coating method (including a sol-gel method and a metal organic decomposition (MOD) method), a sputtering method, a chemical vapor deposition (CVD) method, and a metal organic chemical vapor deposition (MOCVD) method may be applied.

Figure 4:
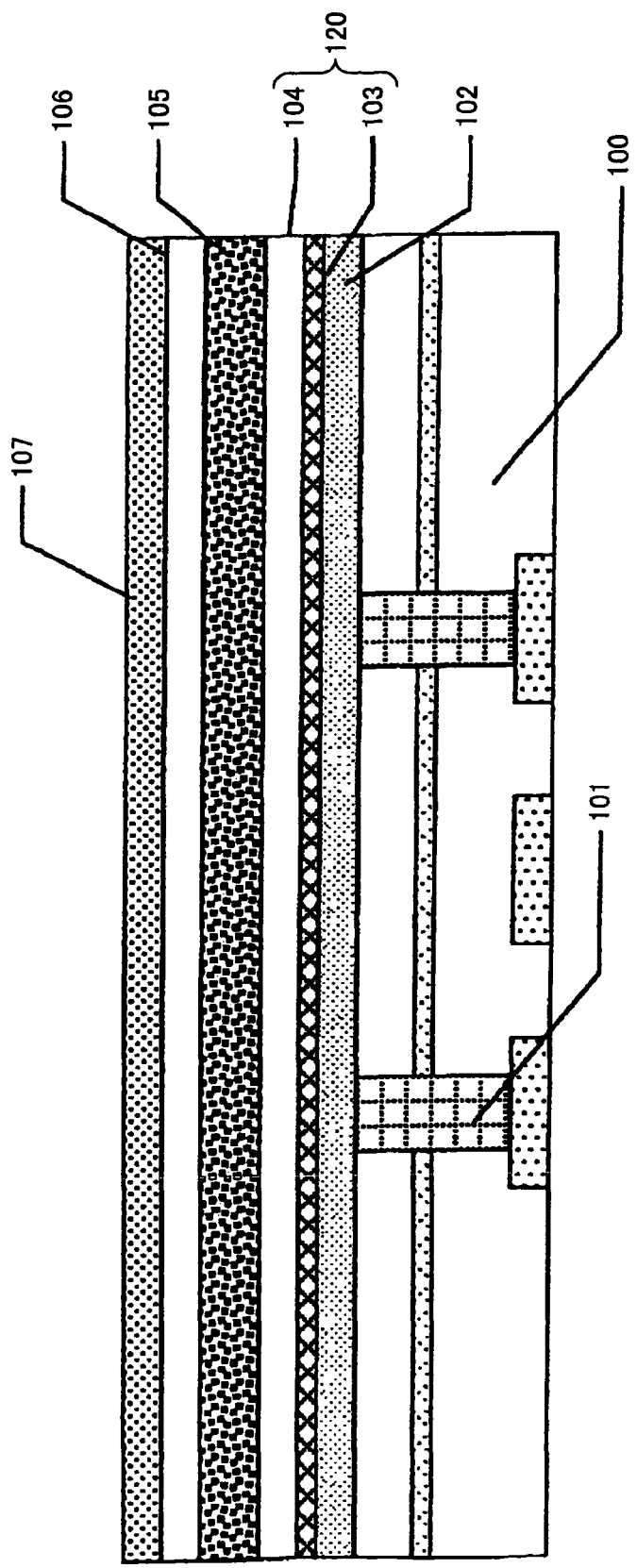
FIG. 4 shows the method of manufacturing the ferroelectric memory device according to the first embodiment.

(3) As shown in FIG. 4, a first hydrogen barrier film 107 is formed on the upper electrode 106. The first hydrogen barrier film 107 is formed to have a tensile stress by arbitrarily adjusting the deposition conditions.

As the material for the first hydrogen barrier film 107, an aluminum oxide ($AlO_x$) film or the like can be given. The material for the first hydrogen barrier film 107 may be an oxide including one or more elements selected from titanium, hafnium, zirconium, magnesium, and tantalum. Since these materials exhibit an excellent hydrogen barrier function, the thickness of the hydrogen barrier film can be reduced. The first hydrogen barrier film 107 may be deposited by using a CVD method, a sputtering method, or the like. For example, an atomic-layer CVD (ALCVD) method may be applied. In this case, various types of organoaluminum may be used as the raw material. For example, trimethylaluminum (TMA) may be used. As the oxidizing agent, ozone ($O_3$) may be used. Since the CVD method not only increases the density of the hydrogen barrier film, but also excels in step coverage characteristics, entrance of reducing elements from the sidewall of the ferroelectric capacitor can be prevented, for example.

The first hydrogen barrier film 107 may be formed by using the same deposition method as that for the upper electrode 106. For example, both the upper electrode 106 and the first hydrogen barrier film 107 may be formed by applying a sputtering method. This enables the first hydrogen barrier film 107 to be continuously deposited after depositing the upper electrode 106 by sputtering without subjecting the upper electrode 106 to the atmosphere, whereby molecules which function as the hydrogen source, such as moisture and organic molecules, can be prevented from being adsorbed on the surface of the upper electrode 106 after depositing the upper electrode 106.

Figure 5:
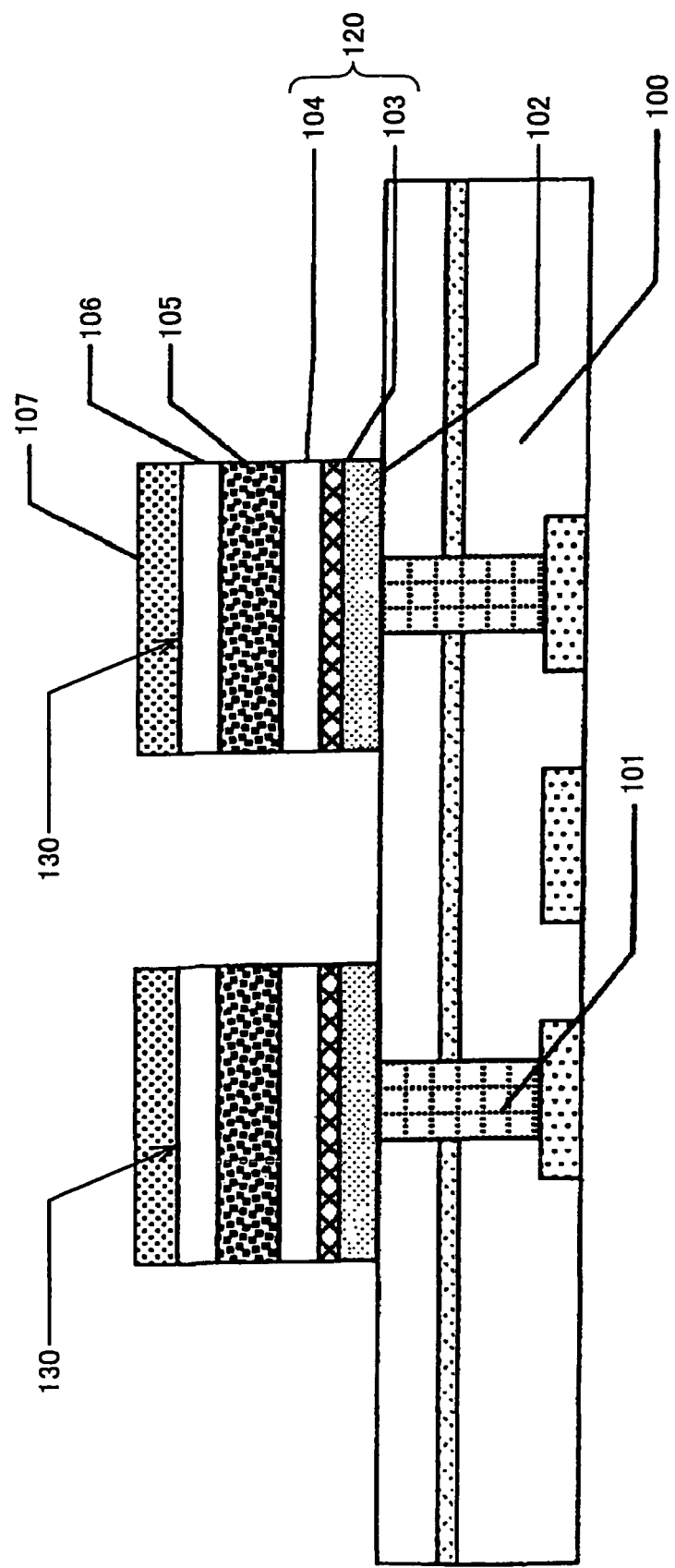
FIG. 5 shows the method of manufacturing the ferroelectric memory device according to the first embodiment.

(4) As shown in FIG. 5, the first hydrogen barrier film 107, the upper electrode 106, the ferroelectric film 105, the lower electrode 120, and the barrier metal layer 102 are patterned to form a ferroelectric capacitor 130. The ferroelectric capacitor 130 is formed on the plug 101. The patterning may be performed using a dry etching method by applying a lithographic technology. The ferroelectric capacitor 130 is then subjected to an annealing treatment at 675° C. for five minutes in an oxygen atmosphere.

Figure 6:
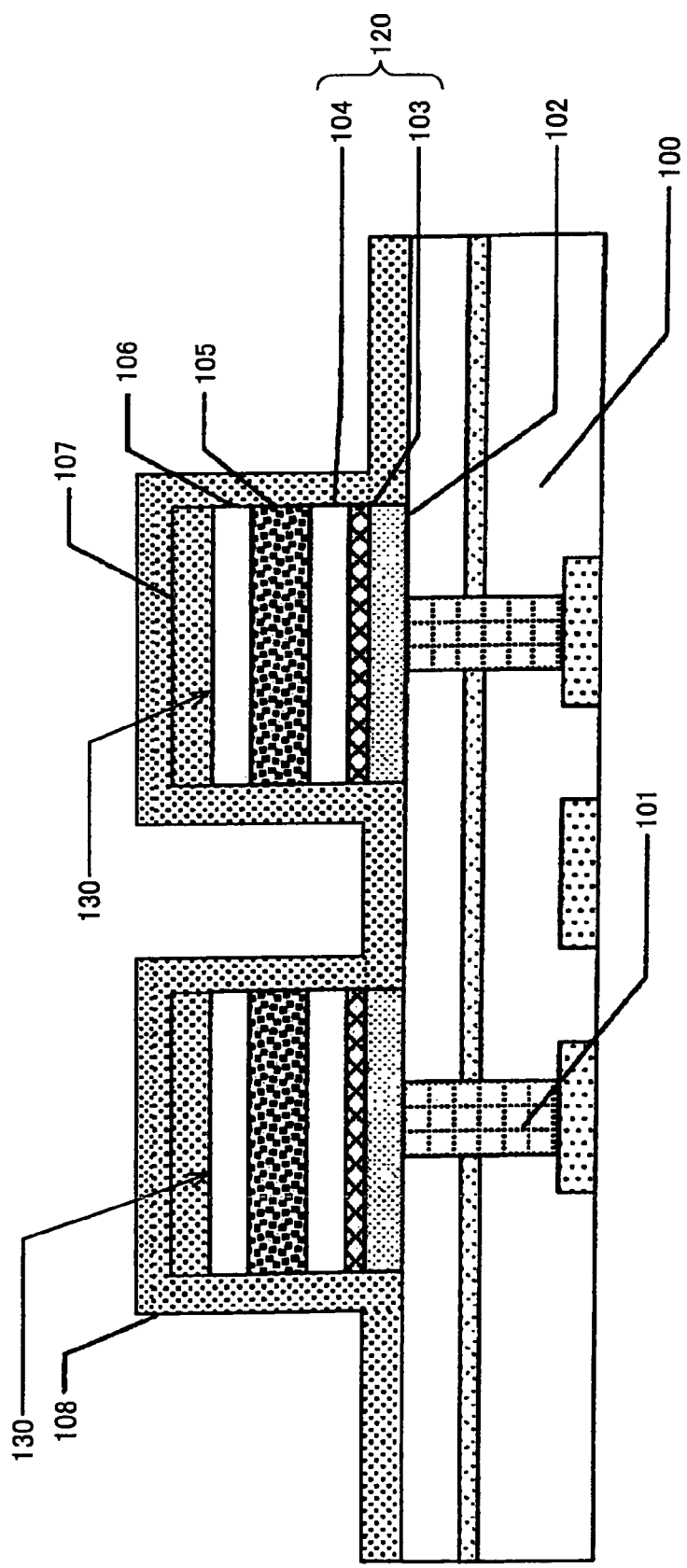
FIG. 6 shows the method of manufacturing the ferroelectric memory device according to the first embodiment.
Figure 7:
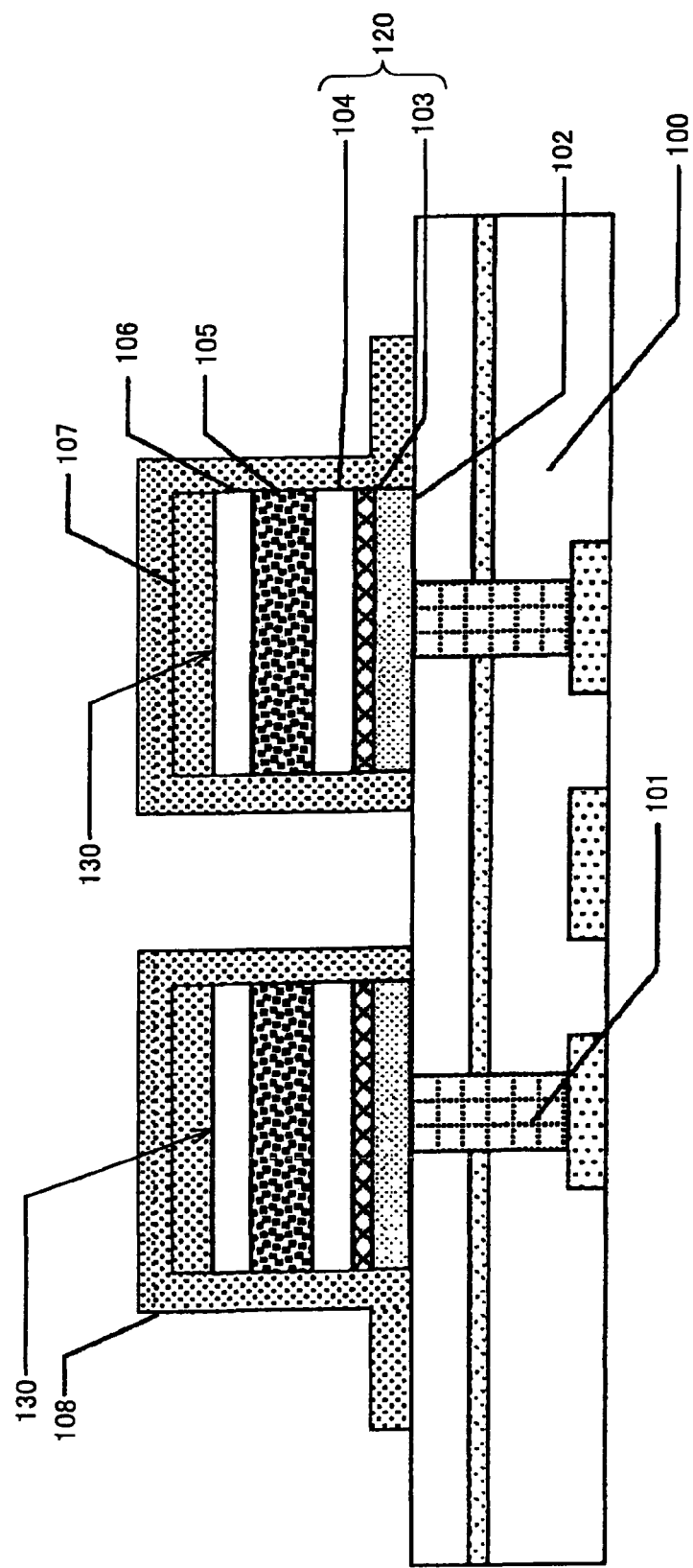
FIG. 7 shows the method of manufacturing the ferroelectric memory device according to the first embodiment.

(5) As shown in FIGS. 6 and 7, a second hydrogen barrier film 108 is formed to cover the ferroelectric capacitor 130. The second hydrogen barrier film 108 is formed to have a tensile stress by arbitrarily adjusting the deposition conditions.

In more detail, the second hydrogen barrier film 108 is formed to cover the first hydrogen barrier film 107 on the ferroelectric capacitor 130, the sidewall of the ferroelectric capacitor 130, and the substrate 100. Specifically, the first and second hydrogen barrier films 107 and 108 are formed in layers on the ferroelectric capacitor 130 (upper electrode 106), and only the second hydrogen barrier film 108 is formed on the sidewall of the ferroelectric capacitor 130. This enables the thickness of the hydrogen barrier film on the upper side of the ferroelectric capacitor 130 to be relatively greater than the thickness of the hydrogen barrier film on the sidewall of the ferroelectric capacitor 130.

As the material for the second hydrogen barrier film 108, the description for the first hydrogen barrier film 107 may be applied. The material for the second hydrogen barrier film 108 may be either the same as or different from the material for the first hydrogen barrier film 107. The deposition method for the second hydrogen barrier film 108 is also the same as described for the first hydrogen barrier film 107. The deposition method for the second hydrogen barrier film 108 may be the same as the deposition method for the first hydrogen barrier film 107 (ALCVD method, for example), or may be different from the deposition method for the first hydrogen barrier film 107 (first hydrogen barrier film: sputtering method, second hydrogen barrier film: ALCVD method, for example).

As shown in FIG. 7, the second hydrogen barrier film 108 is patterned to a desired size.

Figure 8:
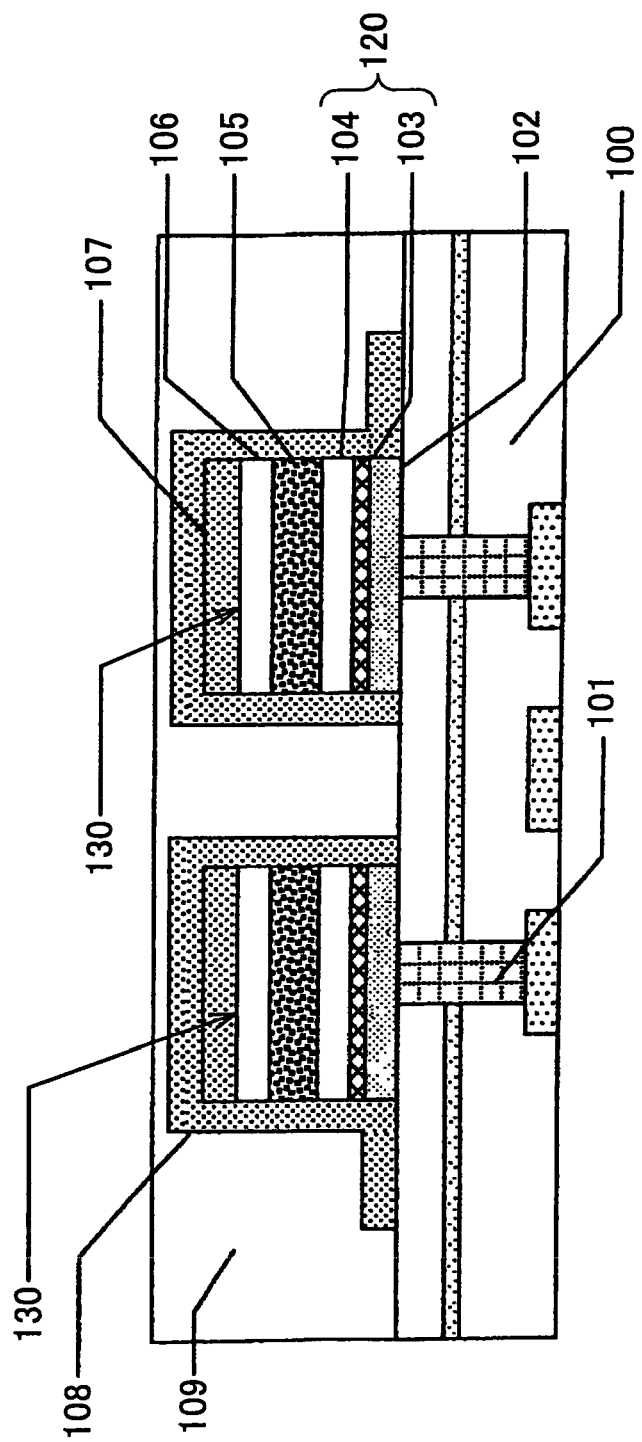
FIG. 8 shows the method of manufacturing the ferroelectric memory device according to the first embodiment.
Figure 9:
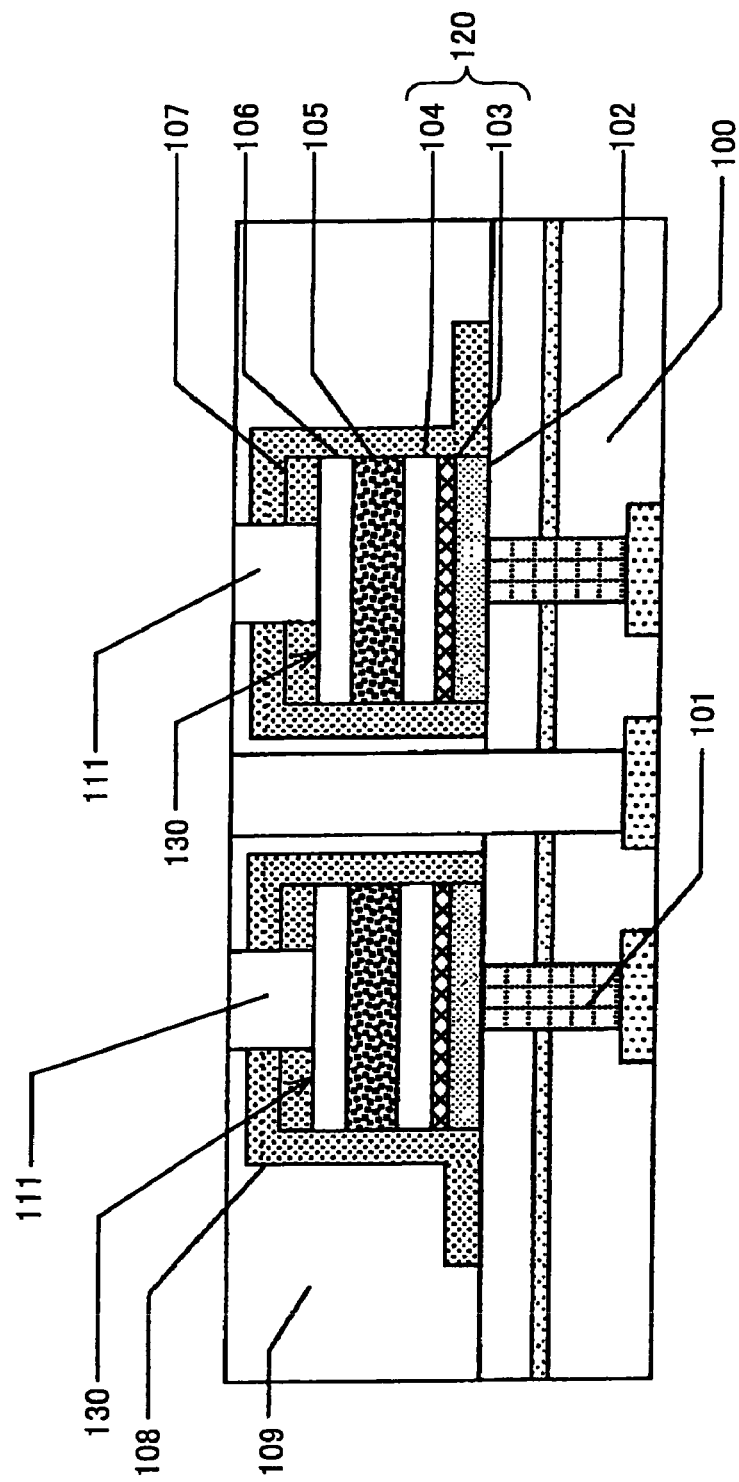
FIG. 9 shows the method of manufacturing the ferroelectric memory device according to the first embodiment.

(6) As shown in FIGS. 8 and 9, an interlayer dielectric 109 is formed, and a contact hole 111 is formed in the interlayer dielectric 109.

As the interlayer dielectric 109, a tetraethylorthosilicate (TEOS)-$SiO_2$ film may be deposited by using a plasma chemical vapor deposition method, for example. The contact hole 111 provides electrical contact with the upper electrode 106 of the ferroelectric thin-film capacitor, and may be formed by using a dry etching method, for example. The substrate 100 is then heated. This aims at discharging moisture contained in the interlayer dielectric 109. When the interlayer dielectric 109 is an ozone TEOS-$SiO_2$ film, it is preferable to heat the substrate 100 under the annealing conditions employed after forming the ferroelectric capacitor 130. For example, the substrate 100 may be subjected to a heat treatment at 675° C. for five minutes in an oxygen atmosphere.

When the interlayer dielectric 109 is a plasma TEOS-$SiO_2$ film, since the moisture content is lower than that of the ozone TEOS-$SiO_2$ film, it suffices that the treatment temperature be equal to or less than the annealing temperature after forming the ferroelectric capacitor 130. This heating aims at causing the ferroelectric capacitor 130 to recover from the plasma damage applied to the ferroelectric capacitor 130 rather than discharging moisture.

Figure 10:
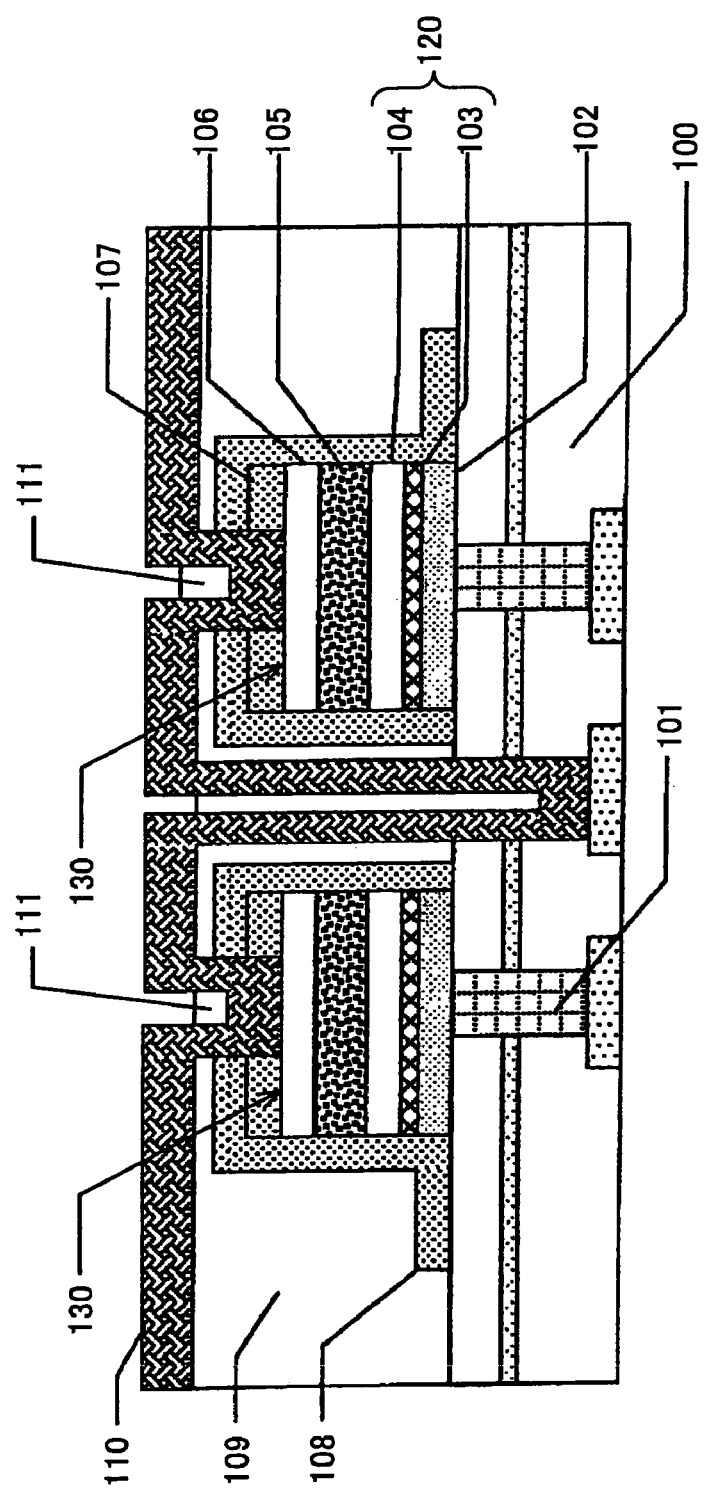
FIG. 10 shows the method of manufacturing the ferroelectric memory device according to the first embodiment.
Figure 11:
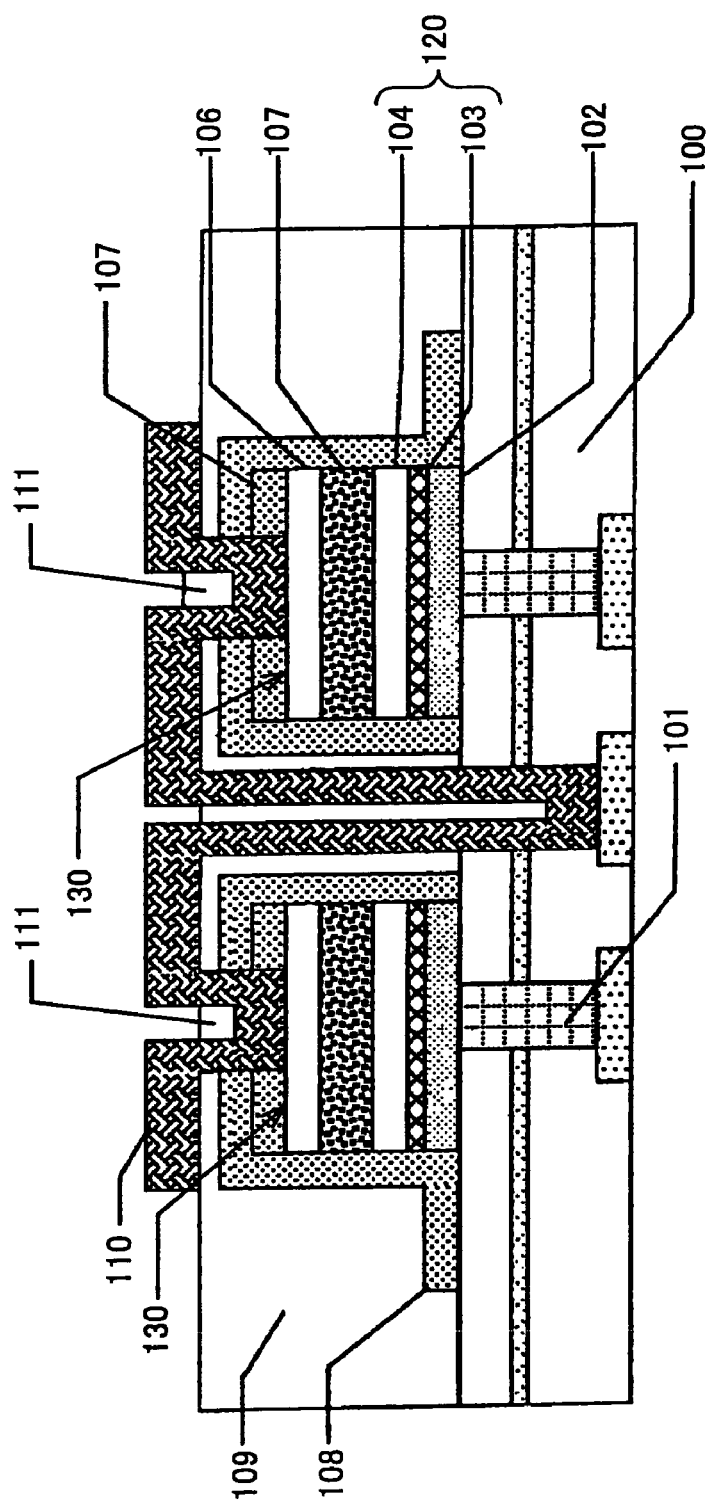
FIG. 11 shows the ferroelectric memory device according to the first embodiment and the method of manufacturing the same.

(7) As shown in FIGS. 10 and 11, a conductive film 110 is formed in the region including the inner surface of the contact hole 111.

The conductive film 110 may be formed by using a sputtering method. The material for the conductive film 110 is not limited insofar as the material exhibits conductivity. In the case where a high-temperature heat treatment is required in the subsequent step, it is preferable to form the conductive film 110 using a thermally and chemically stable noble metal (Pt, Ir, or Pt/Ir oxide film, for example). The conductive film 110 may be formed by a noble metal stacked film. In the case where a heat treatment is unnecessary in the subsequent step, the conductive film 110 may be formed of aluminum, titanium nitride, or the like. As shown in FIG. 11, the conductive film 110 is then patterned.

A ferroelectric memory device including the ferroelectric capacitor 130 can be manufactured in this manner. The ferroelectric memory device includes the substrate 100, the plug 101, the ferroelectric capacitor 130, and the first and second hydrogen barrier films 107 and 108. The hydrogen barrier film (first and second hydrogen barrier films 107 and 108) is formed so that the thickness of the area provided on the upper electrode 106 is greater (about twice or four times, for example) than the thickness of the area provided on the sidewall of the ferroelectric capacitor 130.

Examples of this embodiment are described below.

1.1 Sample

A ferroelectric memory device obtained by the above-described manufacturing method is referred to as a sample 1. In more detail, an $AlO_x$ film was deposited as the first hydrogen barrier film 107 to a thickness of 60 nm by using an ALCVD method. An $AlO_x$ film was deposited as the second hydrogen barrier film 108 to a thickness of 20 nm by using an ALCVD method. The ALCVD deposition conditions were as shown in Table 1.

TABLE 1

| | |
|---|---|
| Organometallic raw material | Trimethylaluminum (TMA) |
| Oxidizing agent | Ozone ($O_3$) |
| Substrate temperature | 300° C. |
| Base pressure | 1 Torr |

The first and second hydrogen barrier films 107 and 108 were deposited by repeatedly performing a series of steps consisting of (1) $O_3$ supply step, (2) $O_3$ purging step, (3) TMA supply step, and (4) TMA purging step until a desired thickness was reached. The steps (1) to (4) were pulsed supplies. Each pulse time was as shown in Table 2.

TABLE 2

| | Pulse time |
|---|---|
| (1) $O_3$ supply | 400 msec |
| (2) $O_3$ purging | 3200 msec |
| (3) TMA supply | 100 msec |
| (4) TMA purging | 800 msec |

A sample 2 was formed for comparison by using a conventional method. Specifically, the formation of the first hydrogen barrier film 107 in the manufacturing steps of the sample 1 was omitted, and an $AlO_x$ film was deposited as the second hydrogen barrier film to a thickness of 80 nm by using an ALCVD method. The resulting sample 2 had the same device structure as that of the sample 1 except that the first hydrogen barrier film was not formed.

1.2 Characteristic Evaluation

The characteristics of the memory devices obtained by each manufacturing method were compared. In this characteristic evaluation, attention was directed to the ferroelectric characteristics of the ferroelectric thin-film capacitor. When an appropriate alternating voltage is applied between the upper and lower electrodes, a certain amount of electric charge occurs on the upper and lower electrodes depending on the amount and the direction of the applied voltage. The applied voltage and the amount of electric charge are respectively plotted on the horizontal axis and the vertical axis in order to monitor this state to obtain a hysteresis loop specific to the ferroelectric caused by polarization reversal. The polarization at a voltage of zero is called a remanent polarization. The greater the remanent polarization, the greater the amount of electric charge (signal), and the more advantageous for reading.

Figure 13C:
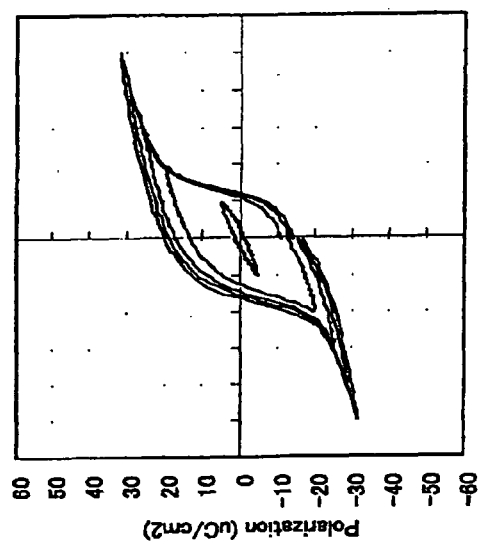
FIGS. 13A to 13C are graphs showing the hysteresis loop of a sample 2 according to Example 1.
Figure 13B:
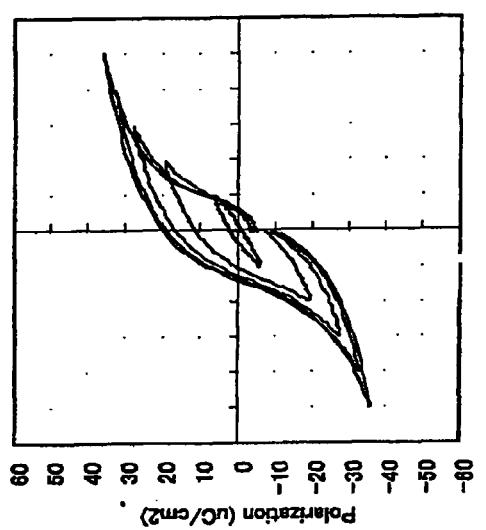
Figure 13A:
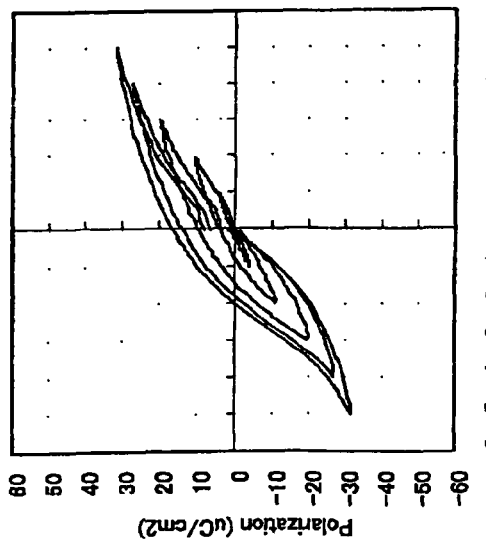

FIGS. 12A to 12C show the hysteresis loop of the ferroelectric capacitor in the sample 1 according to this example. FIGS. 12A to 12C respectively show the cases where the size of the ferroelectric capacitor is 1×1 μm, 10×10 μm, and 100×100 μm. FIGS. 13A to 13C show the hysteresis loop of the ferroelectric capacitor in the sample 2 according to the conventional example. FIGS. 13A to 13C respectively show the cases where the size of the ferroelectric capacitor is 1×1 μm, 10×10 μm, and 100×100 μm.

As is clear from each drawing, a hysteresis loop having an excellent squareness and exhibiting a large remanent polarization was obtained for the sample 1 irrespective of the capacitor size. While ferroelectric characteristics similar to those of the sample 1 were obtained for the sample 2 when the capacitor size was large, the shape of the hysteresis loop is deformed and the remanent polarization is decreased as the capacitor size is decreased. Therefore, it was confirmed that a large difference in the capacitor characteristics occurs due to the difference in the device structure between the sample 1 and the sample 2.

As described above, the difference in the structure between the sample 1 and the sample 2 is only the thickness of the $AlO_x$ hydrogen barrier film provided on the sidewall of the ferroelectric capacitor. Assuming that such a difference affects the ferroelectric characteristics on the sidewall of the ferroelectric capacitor to a large extent, it is expected that such a difference closely relates to the deterioration of the characteristics of the sample 2 accompanying a decrease in the capacitor size.

Figure 14:
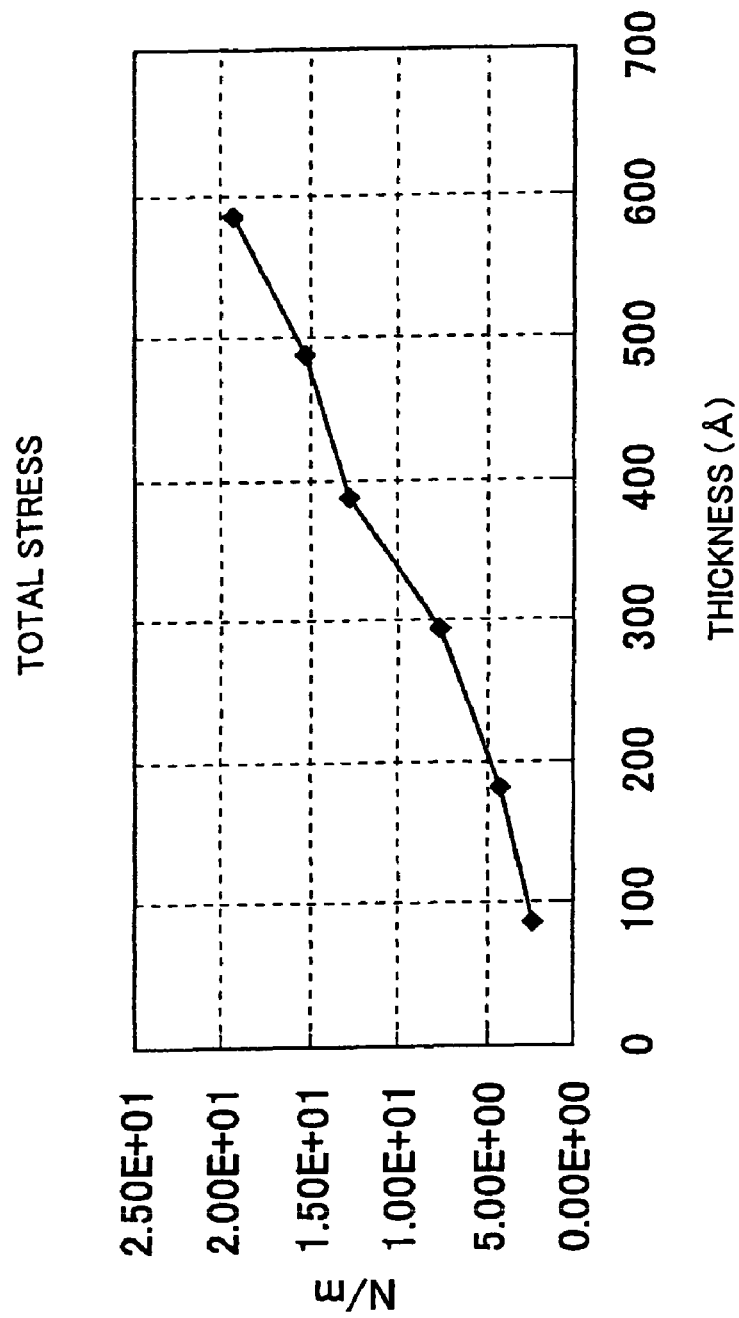
FIG. 14 is a graph showing the relationship between the thickness and the stress of a ferroelectric film.

The stress of the $AlO_x$ film deposited by using an ALCVD method was examined to obtain the results shown in FIG. 14. A tensile stress was applied to the hydrogen barrier film ($AlO_x$ film) of the sample 2 deposited by using an ALCVD method. FIG. 14 shows that the tensile stress is uniformly increased accompanying an increase in the thickness of the hydrogen barrier film. The effect of this phenomenon on the ferroelectric characteristics of the ferroelectric capacitor is described below with reference to FIGS. 15A and 15B.

Figure 15A:
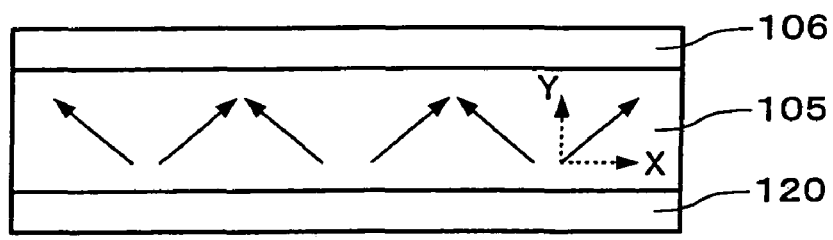
FIGS. 15A and 15B are illustrative of polarization vectors of a ferroelectric capacitor.
Figure 15B:
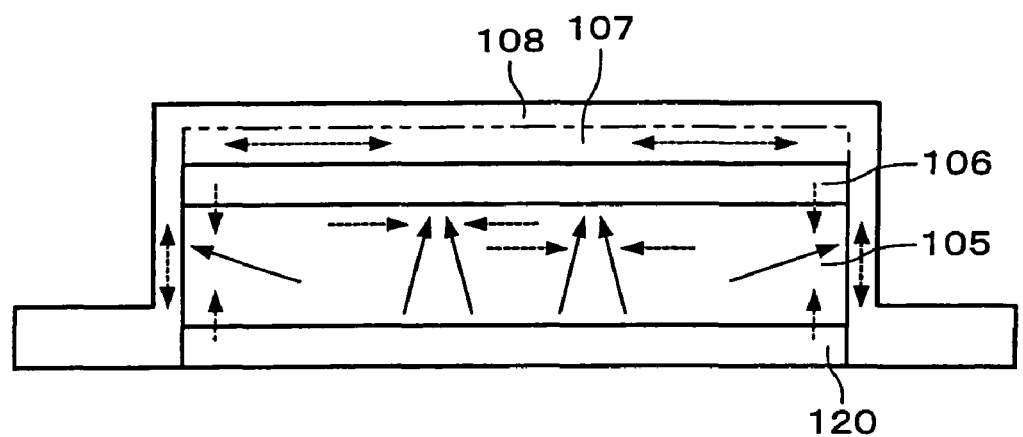

FIG. 15A schematically shows the polarization vectors (solid arrows) of the ferroelectric capacitor on which the hydrogen barrier film is not formed. FIG. 15B schematically shows the polarization vectors (solid arrows) of the ferroelectric capacitor in this example on which the first and second hydrogen barrier films 107 and 108 are formed. In FIG. 15B, the dotted arrows indicate the stress which occurs due to the hydrogen barrier film.

The crystal structure of the ferroelectric film 105 is tetragonal, and the polarization axis is <001>. However, as shown in FIG. 15A, since the ferroelectric film 105 is generally oriented along the (111) direction, the polarization vector extends in the oblique direction which makes a predetermined angle with the direction normal to the surface of the substrate (Y direction). Since the magnitude of the polarization vector (magnitude of the Y direction component in more detail) determines the amount of electric charge which occurs on the electrode, the behavior of the polarization vector is very important.

The polarization vector in this example is considered below with reference to FIG. 15B.

Attention is directed to the portion of the ferroelectric film 105 near the upper electrode 106. Since the first and second hydrogen barrier films 107 and 108 ($AlO_x$ films) deposited on the upper electrode 106 are formed to have a tensile stress, a compressive stress is applied to the upper electrode 106 and the ferroelectric film 105 in contact with the first and second hydrogen barrier films 107 and 108. Since the compressive stress functions to align the polarization vector of the ferroelectric film 105 in the direction normal to the surface of the substrate, the magnitude of the component normal to the surface of the substrate (Y direction component) of the polarization vector is increased. Therefore, since the amount of electric charge occurring on the electrode is increased to that extent, it is advantageous from the viewpoint of read margin.

On the other hand, a phenomenon opposite to that occurring near the upper electrode 106 occurs on the sidewall of the ferroelectric film 105. Since the second hydrogen barrier film 108 ($AlO_x$ film) deposited on the ferroelectric film 105 is formed to have a tensile stress, a compressive stress is applied to the ferroelectric film 105 in contact with the second hydrogen barrier film 108. Since the compressive stress functions to align the polarization vector of the ferroelectric film 105 in the direction parallel to the surface of the substrate, the magnitude of the component normal to the surface of the substrate (Y direction component) of the polarization vector is decreased. This reduces the amount of signal electric charge occurring on the electrode.

Specifically, in the case where the $AlO_x$ hydrogen barrier film directly provided on the ferroelectric capacitor has a tensile stress, since the polarization vector rises in the ferroelectric film near the upper electrode, the amount of electric charge is increased. However, since the polarization vector lies down on the sidewall of the ferroelectric film, the amount of electric charge is decreased.

Therefore, when the hydrogen barrier film is formed at a uniform thickness, a polarization loss significantly occurs on the sidewall of the ferroelectric film as the size of the ferroelectric capacitor is decreased, whereby deterioration of the hysteresis characteristics occurs. This coincides with the capacitor size dependence of the hysteresis characteristics measured for the sample 2. Specifically, it is considered that a large loss of signal electric charge occurs on the sidewall of the ferroelectric capacitor due to the tensile stress of the $AlO_x$ hydrogen barrier film deposited on the sidewall of the ferroelectric film.

In the sample 1, the $AlO_x$ hydrogen barrier film is also disposed on the sidewall of the ferroelectric capacitor. However, the thickness of the hydrogen barrier film is ¼ of that of the sample 2 (sample 1=20 nm, sample 2=80 nm). Since the stress applied to the ferroelectric film is proportional to the thickness of the AlO$_x$ hydrogen barrier film, the compressive stress is decreased (about ¼). It is considered that this prevents the direction of the polarization vector from being affected, whereby the loss of signal electric charge does not occur. Specifically, in this example, sufficient ferroelectric characteristics can be obtained even if the size of the ferroelectric capacitor is reduced due to the absence of capacitor size dependence. In other words, the smaller the capacitor size, the more excellent the ferroelectric characteristics of the ferroelectric capacitor according to this example.

Second Embodiment

FIGS. 16 to 26 schematically show a method of manufacturing a ferroelectric memory device according to a second embodiment of the present invention. In this embodiment, the patterning step of the upper electrode 206 is separately performed from the patterning step of the ferroelectric film 204, the lower electrode 220, and the barrier metal layer 202.

Figure 16:
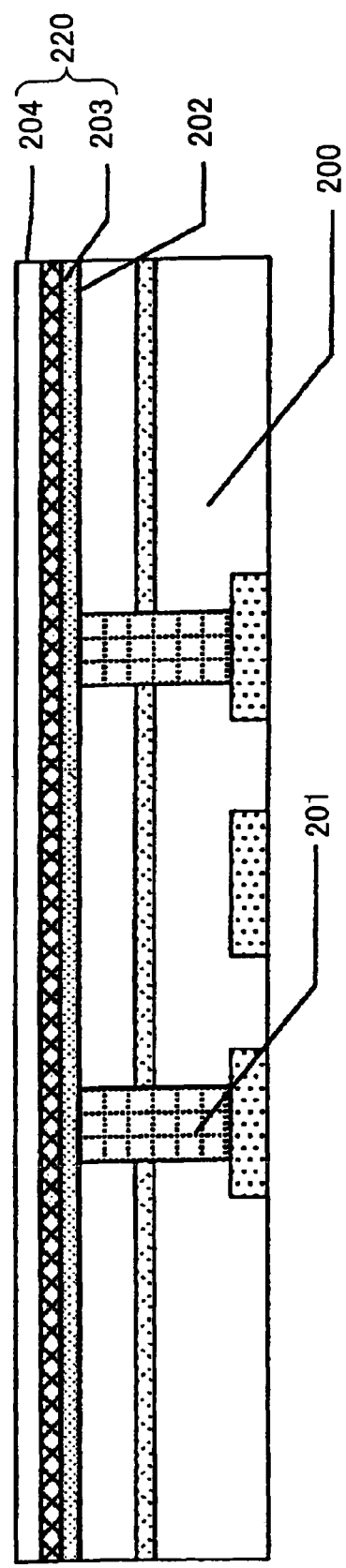
FIG. 16 shows a method of manufacturing a ferroelectric memory device according to a second embodiment.

(1) As shown in FIG. 16, a plug 201 is formed in a substrate 200, and a barrier metal layer 202 and a lower electrode 220 are formed on the plug 201. The details are the same as described for the first embodiment. The lower electrode 220 may be formed by stacking an iridium (Ir) thin film 203 and a platinum (Pt) film 204.

Figure 17:
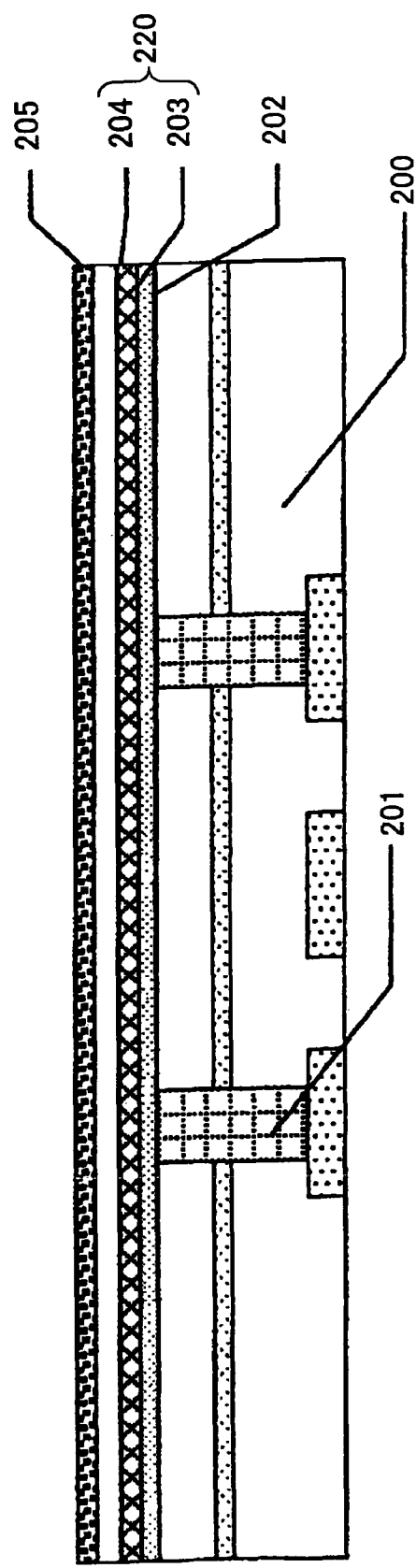
FIG. 17 shows the method of manufacturing the ferroelectric memory device according to the second embodiment.
Figure 18:
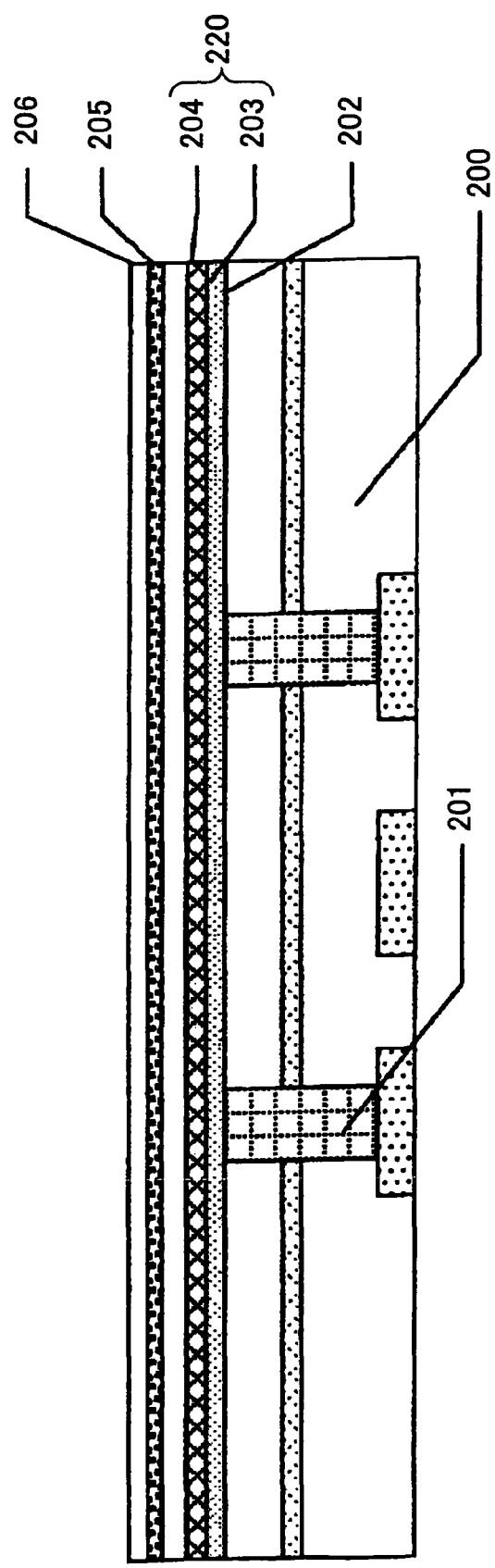
FIG. 18 shows the method of manufacturing the ferroelectric memory device according to the second embodiment.
Figure 19:
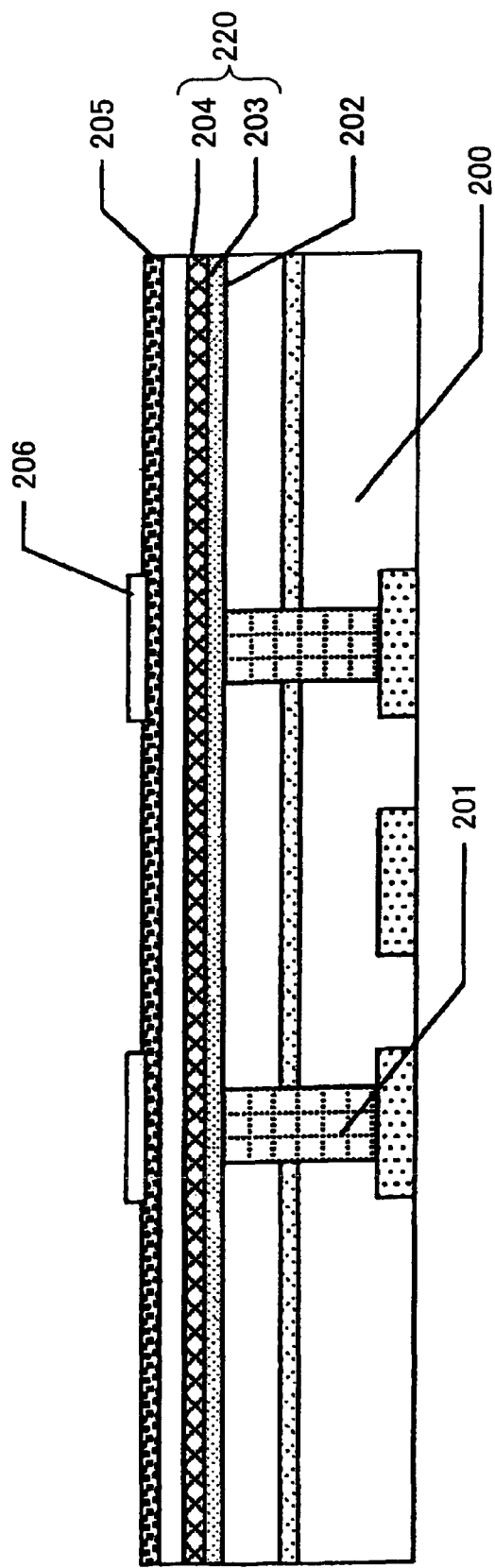
FIG. 19 shows the method of manufacturing the ferroelectric memory device according to the second embodiment.

(2) As shown in FIGS. 17 to 19, a ferroelectric film 205 and an upper electrode 206 are formed on the lower electrode 220.

The material and the deposition method for the ferroelectric film 205 and the upper electrode 206 are the same as described for the first embodiment. However, in this embodiment, the upper electrode 206 is patterned to a desired shape using a resist mask. The upper electrode 206 is formed to be smaller than the planar shape of the ferroelectric film 205 which is patterned to a desired shape in the subsequent step. Specifically, the upper electrode 206 is formed to have a shape which avoids the outer circumferential section of the ferroelectric film 205 after patterning (entire outer circumferential section, for example).

Figure 20:
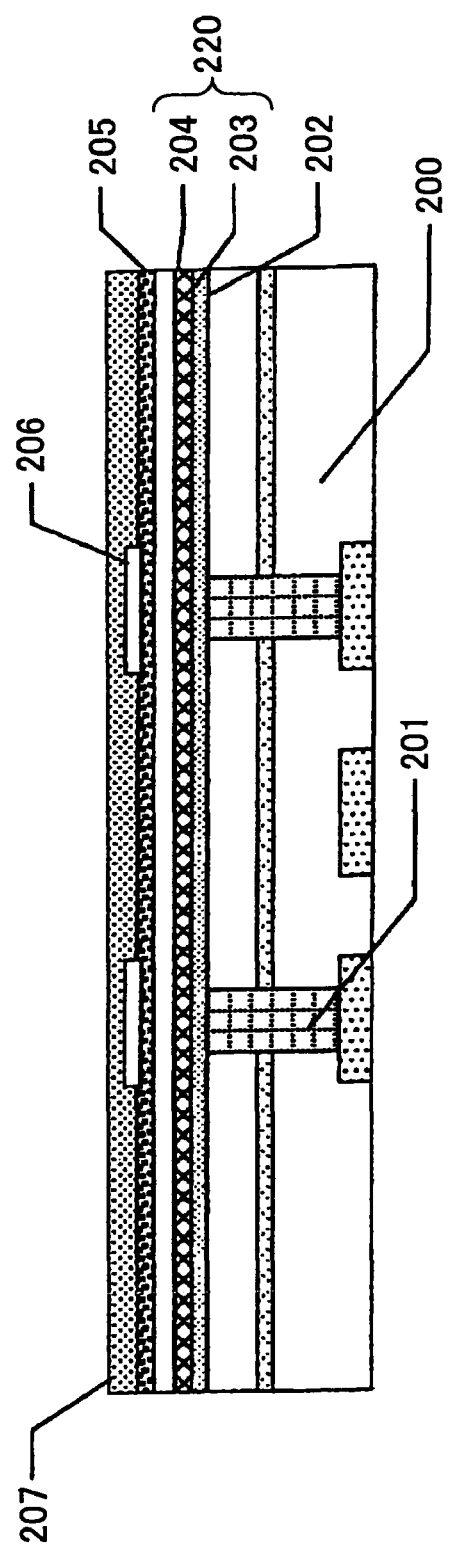
FIG. 20 shows the method of manufacturing the ferroelectric memory device according to the second embodiment.

(3) As shown in FIG. 20, a first hydrogen barrier film 207 is formed on the upper electrode 206 and the ferroelectric film 205 around the upper electrode 206. The first hydrogen barrier film 207 is formed to have a tensile stress by arbitrarily adjusting the deposition conditions.

The first hydrogen barrier film 107 may be formed by depositing an aluminum oxide (AlO$_x$) film using an ALCVD method, for example. As the raw material, various types of organoaluminum (trimethylaluminum (TMA), for example) may be used. As the oxidizing agent, ozone (O$_3$) may be used.

In this embodiment, the material and the deposition method for the first hydrogen barrier film 207 are not limited. For example, the first hydrogen barrier film 207 may be formed by using a sputtering method in the same manner as the upper electrode 206.

Figure 21:
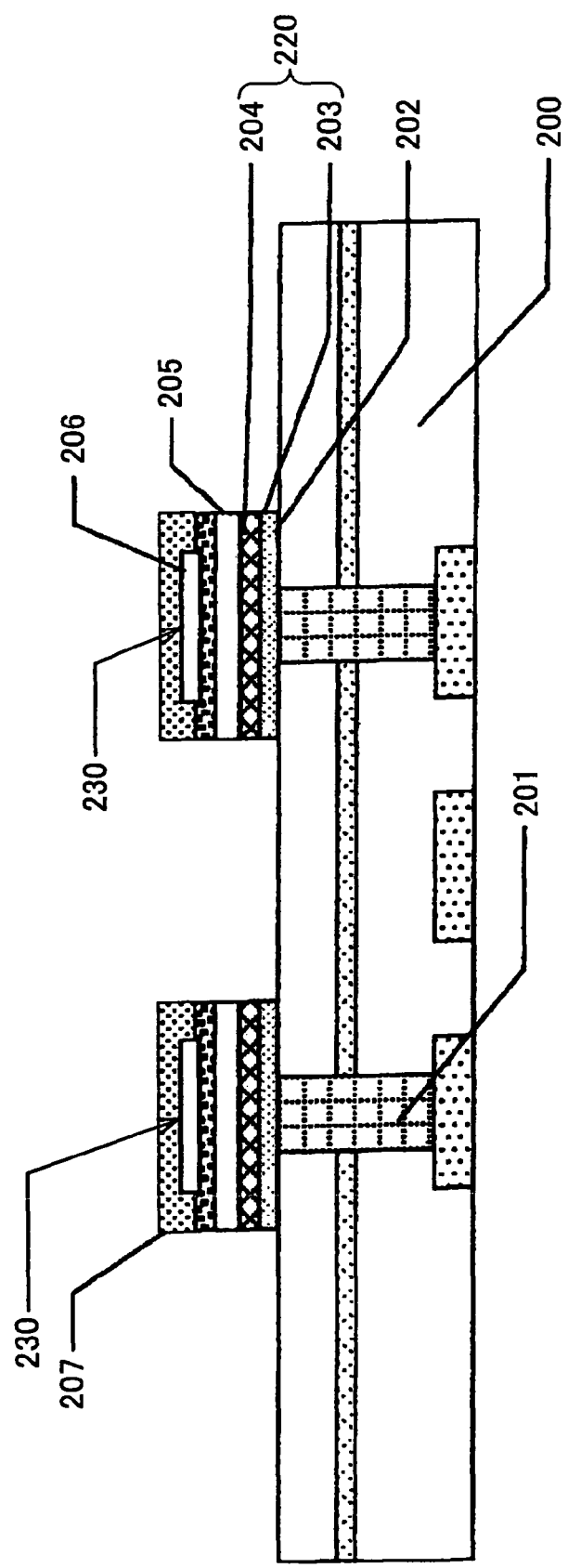
FIG. 21 shows the method of manufacturing the ferroelectric memory device according to the second embodiment.

(4) As shown in FIG. 21, the first hydrogen barrier film 207, the ferroelectric film 205, the lower electrode 220, and the barrier metal layer 202 are patterned to form a ferroelectric capacitor 230.

The ferroelectric capacitor 230 is formed on the plug 201. The patterning may be performed using a dry etching method by applying a lithographic technology. The ferroelectric capacitor 230 is then subjected to an annealing treatment at 675° C. for five minutes in an oxygen atmosphere. The first hydrogen barrier film 207, the ferroelectric film 205, the lower electrode 220, and the barrier metal layer 202 are formed to have a planar shape greater than the planar shape of the upper electrode 206.

Figure 22:
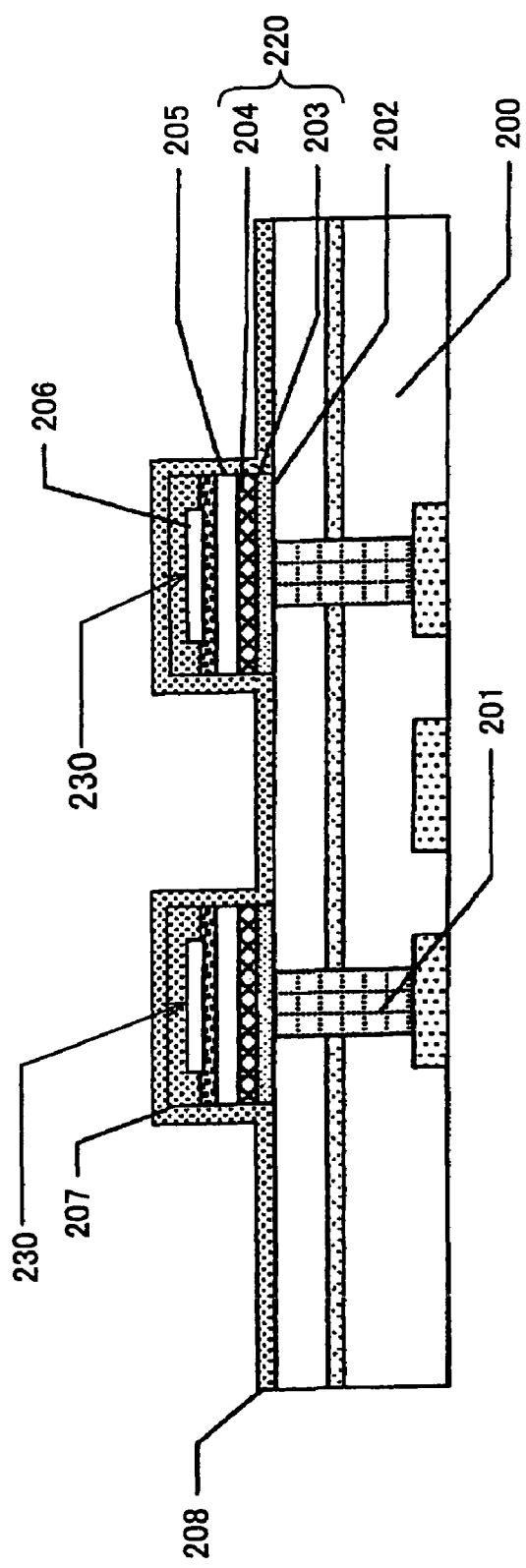
FIG. 22 shows the method of manufacturing the ferroelectric memory device according to the second embodiment.

(5) As shown in FIG. 22, a second hydrogen barrier film 208 is formed to cover the ferroelectric capacitor 230. The second hydrogen barrier film 208 is formed to have a tensile stress by arbitrarily adjusting the deposition conditions.

In more detail, the second hydrogen barrier film 208 is formed to cover the first hydrogen barrier film 207 on the ferroelectric capacitor 230, the sidewall of the ferroelectric capacitor 230, and the substrate 200. Specifically, the first and second hydrogen barrier films 207 and 208 are formed in layers on the ferroelectric capacitor 230 (upper electrode 206, for example), and only the second hydrogen barrier film 208 is formed on the sidewall of the ferroelectric capacitor 230. This enables the thickness of the hydrogen barrier film on the upper side of the ferroelectric capacitor 230 to be relatively greater than the thickness of the hydrogen barrier film on the sidewall of the ferroelectric capacitor 230.

As the material for the second hydrogen barrier film 208, the description for the first hydrogen barrier film 207 may be applied. The material for the second hydrogen barrier film 208 may be either the same as or different from the material for the first hydrogen barrier film 207. The deposition method for the second hydrogen barrier film 208 is also the same as described for the first hydrogen barrier film 207. The deposition method for the second hydrogen barrier film 208 may be the same as the deposition method for the first hydrogen barrier film 207 (ALCVD method, for example), or may be different from the deposition method for the first hydrogen barrier film 207 (first hydrogen barrier film: sputtering method, second hydrogen barrier film: ALCVD method, for example).

Figure 23:
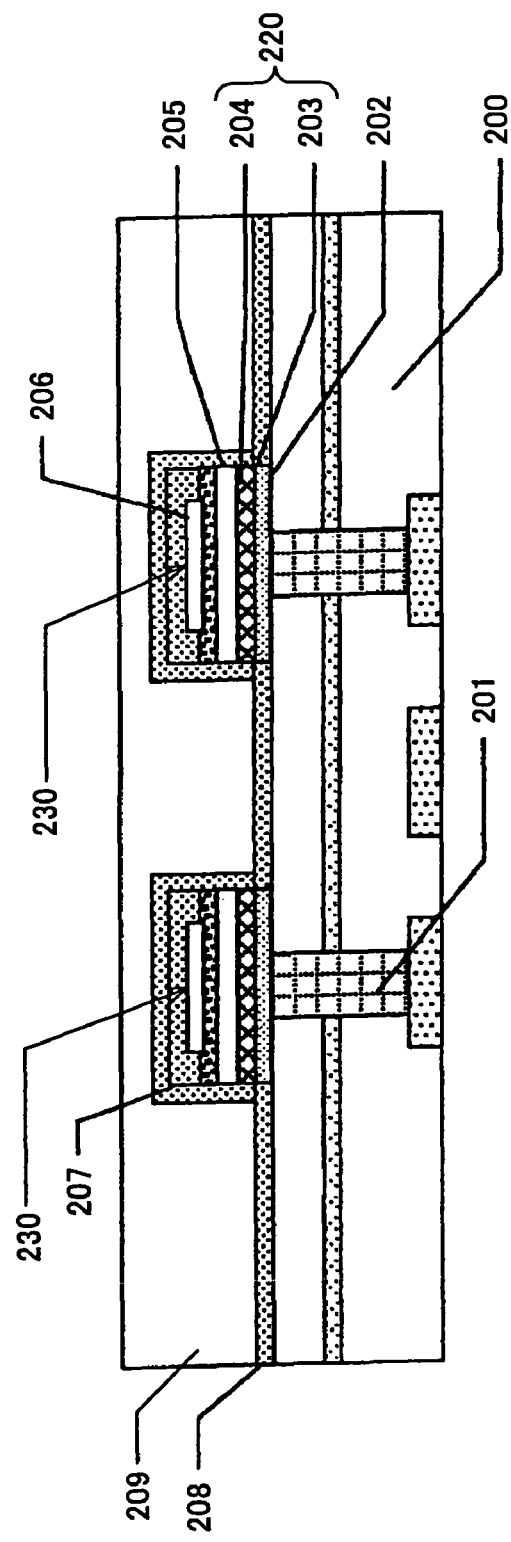
FIG. 23 shows the method of manufacturing the ferroelectric memory device according to the second embodiment.
Figure 24:
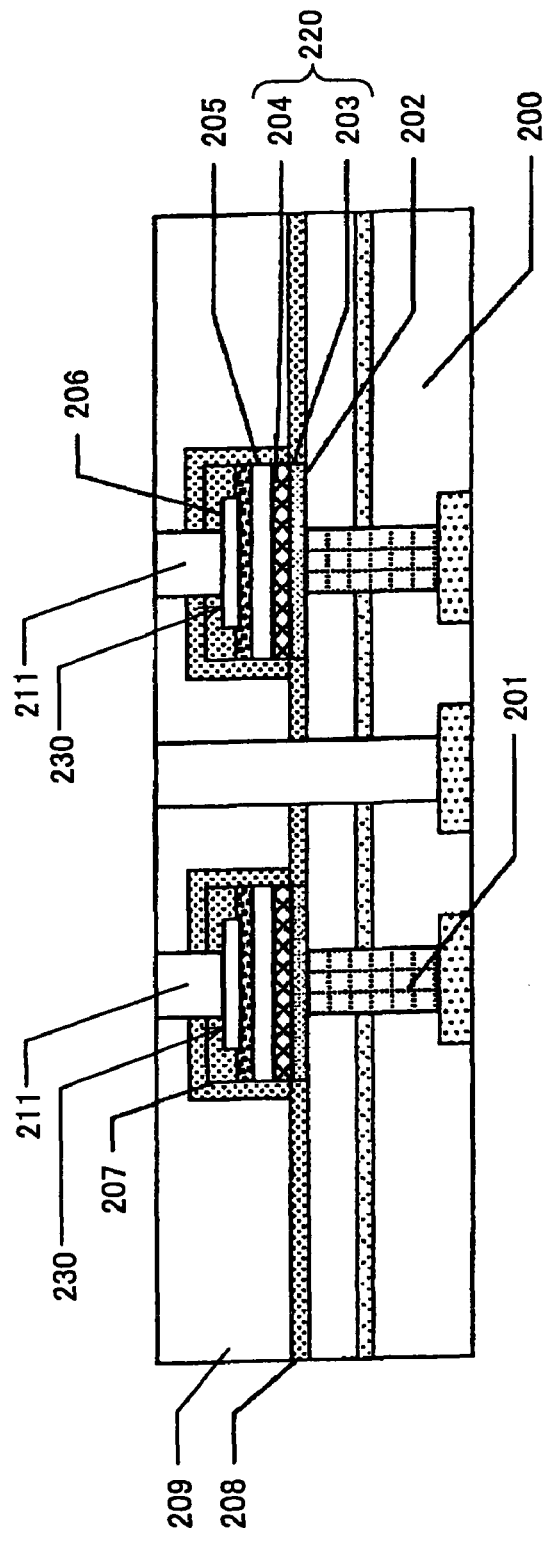
FIG. 24 shows the method of manufacturing the ferroelectric memory device according to the second embodiment.

(6) As shown in FIGS. 23 and 24, an interlayer dielectric 209 is formed, and a contact hole 211 is formed in the interlayer dielectric 209.

As the interlayer dielectric 209, a tetraethylorthosilicate (TEOS)-SiO$_2$ film may be deposited by using a plasma chemical vapor deposition method, for example. The contact hole 211 may be formed by using a dry etching method, for example. The substrate 200 is then heated in the same manner as described in the first embodiment.

Figure 25:
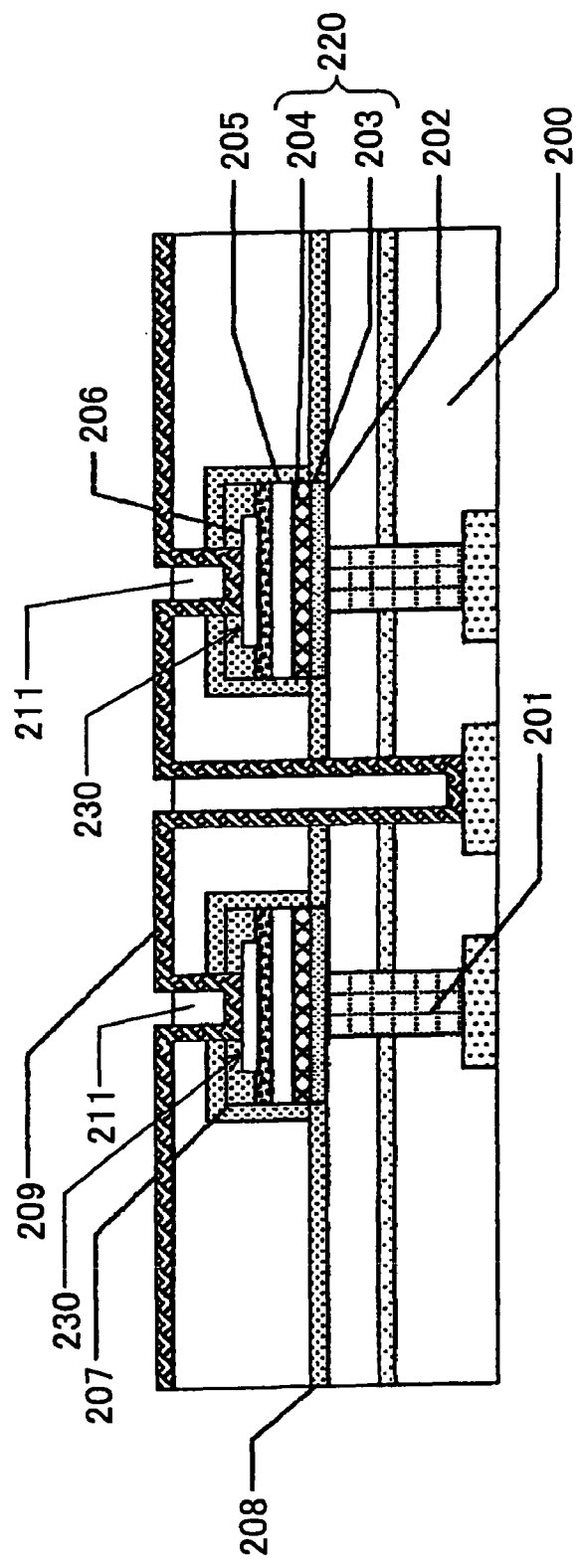
FIG. 25 shows the method of manufacturing the ferroelectric memory device according to the second embodiment.
Figure 26:
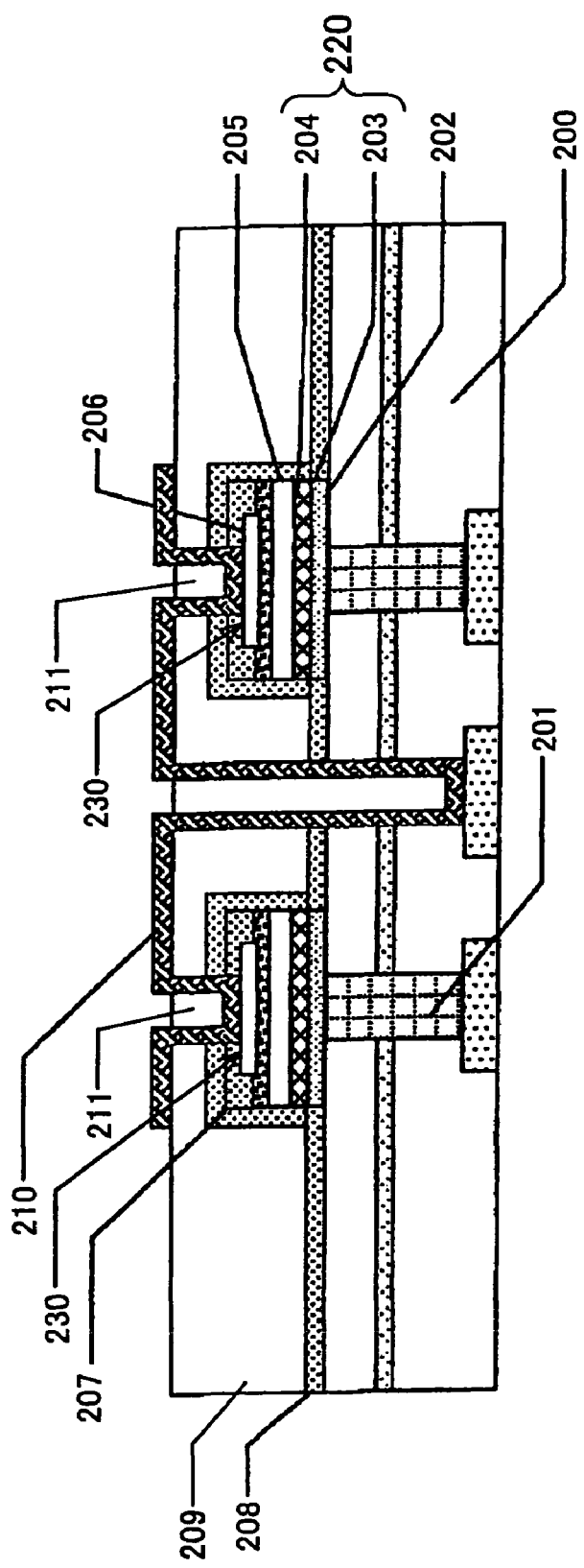
FIG. 26 shows the ferroelectric memory device according to the second embodiment and the method of manufacturing the same.

(7) As shown in FIGS. 25 and 26, a conductive film 210 is formed in the region including the inner surface of the contact hole 211. The conductive film 210 is deposited by using a sputtering method, and is then patterned. The material for the conductive film 210 is not limited insofar as the material exhibits conductivity, and the description for the first embodiment may be applied.

A ferroelectric memory device including the ferroelectric capacitor 230 can be manufactured in this manner. The ferroelectric memory device includes the substrate 200, the plug 201, the ferroelectric capacitor 230, and the first and second hydrogen barrier films 207 and 208. The planar shape of the upper electrode 206 is smaller than the planar shape of the ferroelectric film 205. The hydrogen barrier film (first and second hydrogen barrier films 207 and 208) is formed so that the thickness of the area provided on the upper electrode 206 is greater (about twice or four times, for example) than the thickness of the area provided on the sidewall of the ferroelectric capacitor 230.

Examples of this embodiment are described below.

2.1 Sample

A ferroelectric memory device obtained by the above-described manufacturing method is referred to as a sample 3. In more detail, an AlO$_x$ film was deposited as the first hydrogen barrier film 207 to a thickness of 60 nm by using an ALCVD method. An AlO$_x$ film was deposited as the second hydrogen barrier film 208 to a thickness of 20 nm by using an ALCVD method. As the details of the ALCVD deposition conditions, the description of Example 1 may be applied.

A sample 4 was formed for comparison by using a conventional method. Specifically, the formation of the first hydrogen barrier film 207 in the manufacturing steps of the sample 3 was omitted, and an $AlO_x$ film was deposited as the second hydrogen barrier film to a thickness of 80 nm by using an ALCVD method. The resulting sample 4 had the same device structure as that of the sample 3 except that the first hydrogen barrier film was not formed.

2.2 Characteristic Evaluation

The characteristics of the memory devices obtained by each manufacturing method were compared. In this characteristic evaluation, attention was directed to the ferroelectric characteristics of the ferroelectric thin-film capacitor. When an appropriate alternating voltage is applied between the upper and lower electrodes, a certain amount of electric charge occurs on the upper and lower electrodes depending on the amount and the direction of the applied voltage. The applied voltage and the amount of electric charge are respectively plotted on the horizontal axis and the vertical axis in order to monitor this state to obtain a hysteresis loop specific to the ferroelectric caused by polarization reversal. The polarization at a voltage of zero is called a remanent polarization. The greater the remanent polarization, the greater the amount of electric charge (signal), and the more advantageous for reading.

Figure 27:
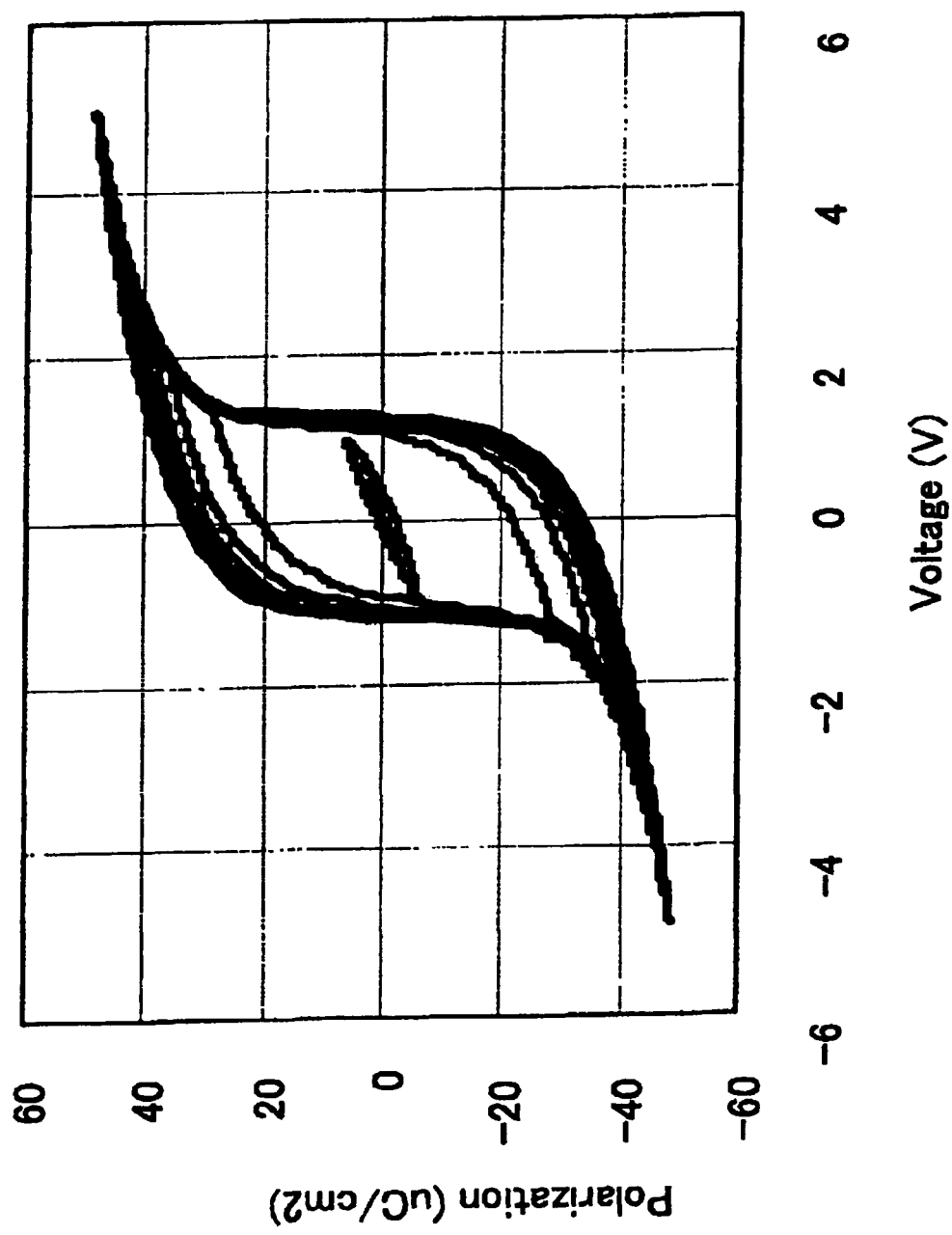
FIG. 27 is a graph showing the hysteresis loop of a sample 3 according to Example 2.
Figure 28:
FIG. 28 is a graph showing the hysteresis loop of a sample 4 according to Example 2.

FIG. 27 shows the hysteresis loop of the ferroelectric capacitor in the sample 3 according to this example, and FIG. 28 shows the hysteresis loop of the ferroelectric capacitor in the sample 4 according to the conventional example.

As is clear from each drawing, while a hysteresis loop having an excellent squareness and a large remanent polarization is obtained for the sample 3, the sample 4 shows a deformed hysteresis loop and has a small remanent polarization. It was confirmed that a large difference in the capacitor characteristics occurs after interconnection due to the difference in the device formation process between the sample 3 and the sample 4.

In addition to the examination of Example 1, the following examination may be considered.

A resist mask is generally used to etch the ferroelectric capacitor. In this example, a resist mask with a desired shape is formed to pattern the ferroelectric film, the lower electrode, and the barrier metal layer. In order to remove the resist mask after patterning, ashing is generally performed. In the ashing step, nitrogen or oxygen plasma, water, methanol, or the like is used. However, when hydrogen molecules generated when these molecules are made into plasma or react with the resist reach the upper electrode after removal of the resist, the hydrogen molecules dissociate to enter the ferroelectric film as activated hydrogen radicals. If such a phenomenon occurs, the ferroelectric film is reduced at the interface between the upper electrode and the ferroelectric layer, whereby the electrical characteristics deteriorate to a considerable extent. Fluorine-containing molecules are used as an etchant when etching a noble metal such as platinum used as the upper electrode or etching the ferroelectric material. Since these molecules are included in the resist, these molecules are released during resist ashing. Since a fluorine atom is an element which exhibits a strong reducing effect, a fluorine atom reduces the ferroelectric film in the same manner as hydrogen, thereby causing the characteristics of the ferroelectric film to deteriorate to a considerable extent. If the crystallinity of the ferroelectric film is disordered due to the reducing effect, it is difficult to recover the crystallinity even if a heat treatment is performed in the subsequent step. In the case where a $TEOS-SiO_2$ film is deposited on the ferroelectric capacitor as the interlayer dielectric, if hydrogen generated during the deposition process enters from the upper electrode, hydrogen reduces the ferroelectric film at the interface between the upper electrode and the ferroelectric film, thereby causing the electrical characteristics of the ferroelectric film to deteriorate to a considerable extent. It is considered that the characteristics of the sample 4 deteriorate to a large extent due to hydrogen damage caused by ashing of the resist mask after etching of the ferroelectric capacitor and deposition of the $TEOS-SiO_2$ film as the interlayer dielectric.

In the sample 3, the first hydrogen barrier film 207 is formed after forming the upper electrode of the ferroelectric capacitor by patterning. Therefore, reducing elements can be prevented from reaching the upper electrode in the atmosphere employed for resist mask ashing performed after etching the ferroelectric film 205, the lower electrode 220, and the barrier metal layer 202. Moreover, since the second hydrogen barrier film 208 is applied after forming the ferroelectric capacitor 230, a hydrogen barrier film thicker than that on the sidewall of the capacitor is formed on the upper electrode 206. Therefore, hydrogen generated during formation of the interlayer dielectric 209 can be completely prevented from entering the ferroelectric film 205 from the upper electrode 206. As a result, as shown in FIG. 27, excellent ferroelectric characteristics free from hydrogen damage can be obtained.

2.3 Characteristic Evaluation

The ferroelectric characteristics are compared between the sample 3 obtained in this example and the sample 1 obtained in Example 1. From the comparison of the hysteresis characteristics between FIGS. 12A to 12C (sample 1) and FIG. 27 (sample 3), the hysteresis loop obtained for the sample 3 generally excels in squareness and exhibits excellent hysteresis characteristics.

The sample 1 was formed by applying a method of collectively etching the upper electrode 106, the ferroelectric film 105, the lower electrode layer 120, and the barrier metal layer 102 using the mask provided on the upper electrode 106. On the other hand, the sample 3 of this example is formed by patterning only the upper electrode 206 in advance, and etching the ferroelectric film 205, the lower electrode film 220, and the barrier metal layer 202 to have an area greater than that of the upper electrode 206. In this case, etching damage occurs on the sidewall of the ferroelectric film 205 in the same manner as in the sample 1. However, since only the area of the ferroelectric film 205 positioned between the upper electrode 206 and the lower electrode 220 contributes to the electrical characteristics of the ferroelectric capacitor 230, the damaged area on the sidewall of the ferroelectric film 205 does not affect the electrical characteristics of the ferroelectric capacitor 230. The term "etching damage" used herein refers to damage caused by etching, and means a phenomenon in which crystallinity is disordered due to exposure to etching gas, whereby the original ferroelectric characteristics cannot be obtained. In the area subjected to the etching damage, since a volatile element is mainly in deficit, the chemical bond is unstable. Such a damaged area is easily reduced by hydrogen or moisture generated in the subsequent step to form a layer with a low dielectric constant, thereby causing the electrical characteristics of the ferroelectric capacitor to deteriorate. Therefore, the device formation process and the device structure of the sample 3 in this example are extremely effective for improving the process resistance of the ferroelectric capacitor.

Third Embodiment

FIGS. 29 to 41 schematically show a method of manufacturing a ferroelectric memory device according to a third embodiment of the present invention. In this embodiment, a third hydrogen barrier film 309 is formed in addition to first and second hydrogen barrier films 307 and 308.

Figure 29:
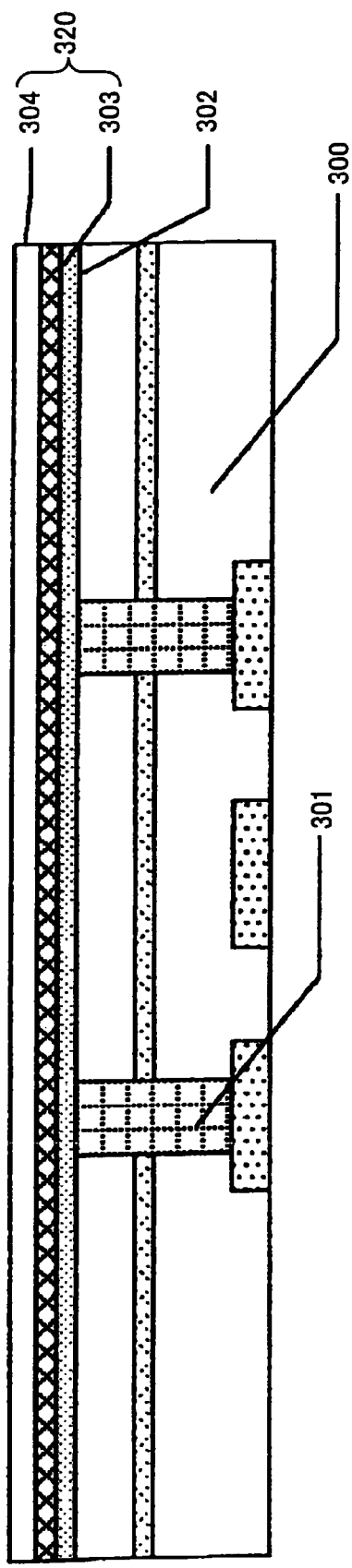
FIG. 29 shows a method of manufacturing a ferroelectric memory device according to a third embodiment.

(1) As shown in FIG. 29, a plug 301 is formed in a substrate 300, and a barrier metal layer 302 and a lower electrode 320 are formed on the plug 301. The details are the same as described in the first embodiment. The lower electrode 320 may be formed by stacking an iridium (Ir) thin film 303 and a platinum (Pt) film 304.

Figure 30:
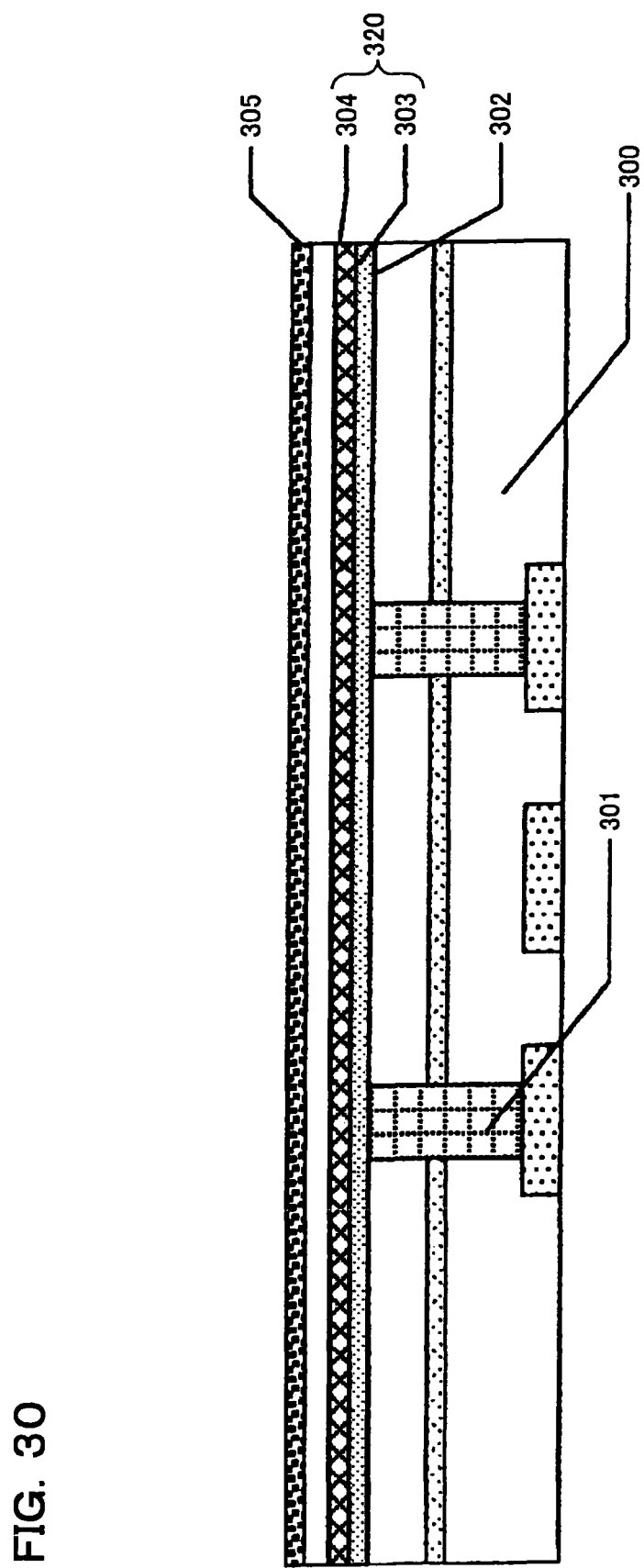
FIG. 30 shows the method of manufacturing the ferroelectric memory device according to the third embodiment.
Figure 31:
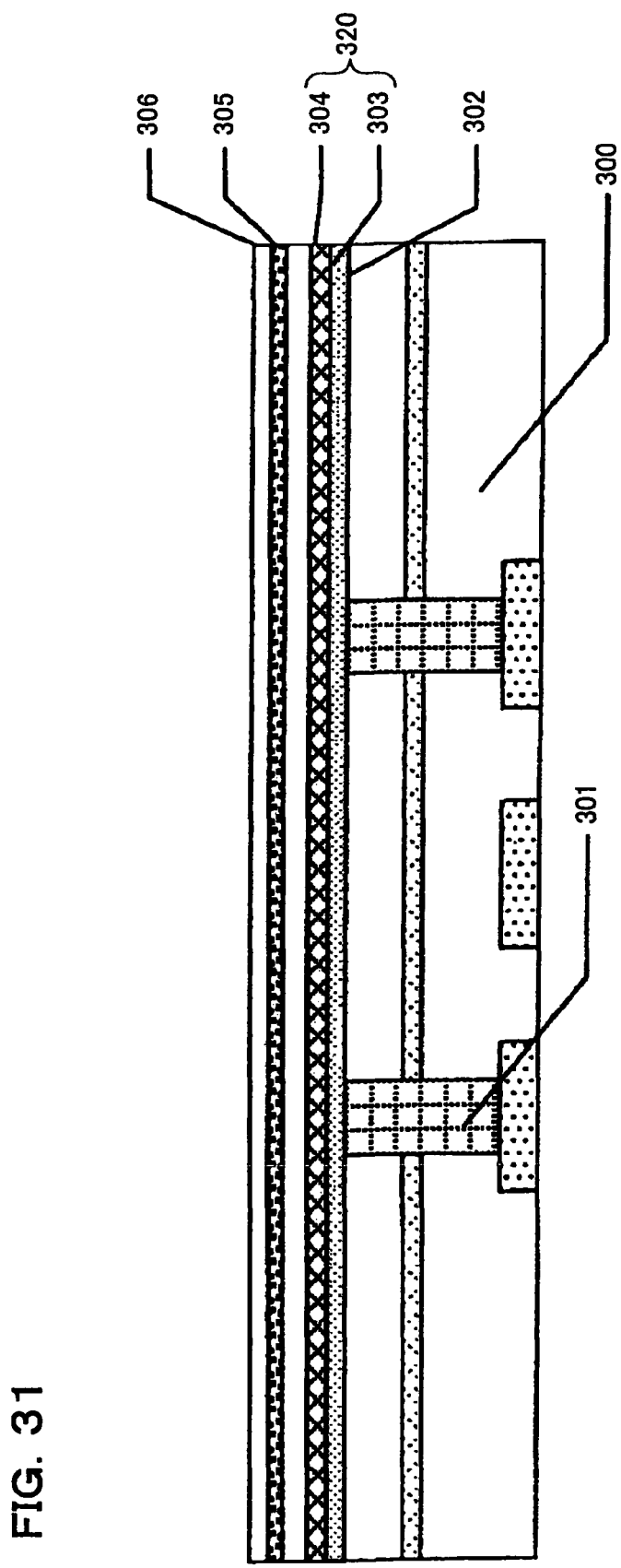
FIG. 31 shows the method of manufacturing the ferroelectric memory device according to the third embodiment.

(2) As shown in FIGS. 30 and 31, a ferroelectric film 305 and an upper electrode 306 are formed on the lower electrode 320. The material and the deposition method for the ferroelectric film 305 and the upper electrode 306 are the same as described in the first embodiment.

Figure 32:
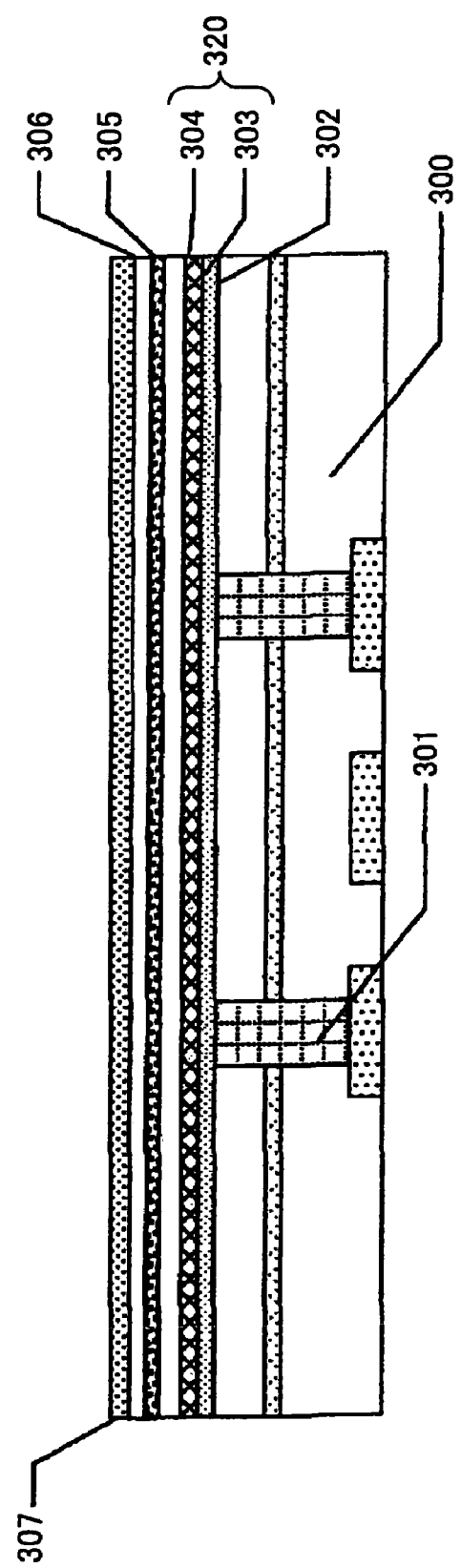
FIG. 32 shows the method of manufacturing the ferroelectric memory device according to the third embodiment.

(3) As shown in FIG. 32, the first hydrogen barrier film 307 is formed on the upper electrode 306. The first hydrogen barrier film 307 is formed to have a tensile stress by arbitrarily adjusting the deposition conditions.

The first hydrogen barrier film 307 may be formed by depositing an aluminum oxide ($AlO_x$) film using an ALCVD method, for example. As the raw material, various types of organoaluminum (trimethylaluminum (TMA), for example) may be used. As the oxidizing agent, ozone ($O_3$) may be used.

In this embodiment, the material and the deposition method for the first hydrogen barrier film 307 are not limited. For example, the first hydrogen barrier film 307 may be formed by using a sputtering method in the same manner as the upper electrode 306.

Figure 33:
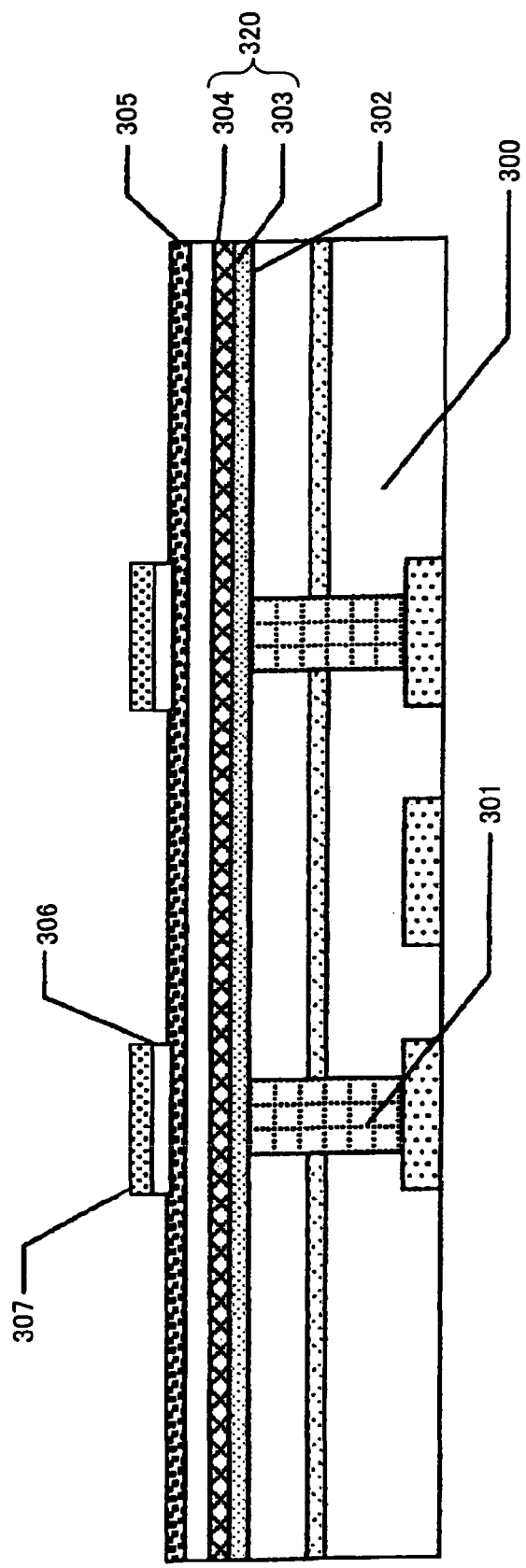
FIG. 33 shows the method of manufacturing the ferroelectric memory device according to the third embodiment.

(4) As shown in FIG. 33, the first hydrogen barrier film 307 and the upper electrode 306 are patterned to a desired shape. The first hydrogen barrier film 307 and the upper electrode 306 are formed to be smaller than the planar shape of the ferroelectric film 305 which is patterned to a desired shape in the subsequent step. Specifically, the first hydrogen barrier film 307 and the upper electrode 306 are formed to have a shape which avoids the outer circumferential section of the ferroelectric film 305 after patterning (entire outer circumferential section, for example).

Figure 34:
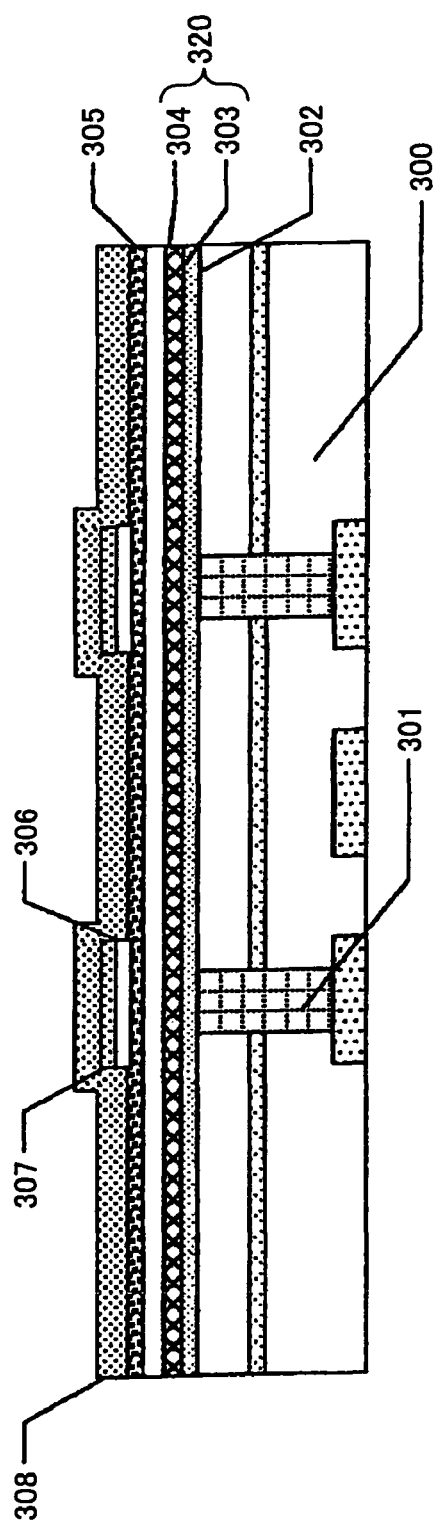
FIG. 34 shows the method of manufacturing the ferroelectric memory device according to the third embodiment.

(5-1) As shown in FIG. 34, the second hydrogen barrier film 308 is formed on the first hydrogen barrier film 307 and the ferroelectric film 305 around the first hydrogen barrier film 307. Specifically, the first and second hydrogen barrier films 307 and 308 are formed in layers on the upper electrode 306. The second hydrogen barrier film 308 is formed to have a tensile stress by arbitrarily adjusting the deposition conditions.

As the material for the second hydrogen barrier film 308, the description for the first hydrogen barrier film 307 may be applied. The material for the second hydrogen barrier film 308 may be either the same as or different from the material for the first hydrogen barrier film 307. The deposition method for the second hydrogen barrier film 308 is also the same as described for the first hydrogen barrier film 307. The deposition method for the second hydrogen barrier film 308 may be the same as the deposition method for the first hydrogen barrier film 307 (ALCVD method, for example), or may be different from the deposition method for the first hydrogen barrier film 307 (first hydrogen barrier film: sputtering method, second hydrogen barrier film: ALCVD method, for example).

Figure 35:
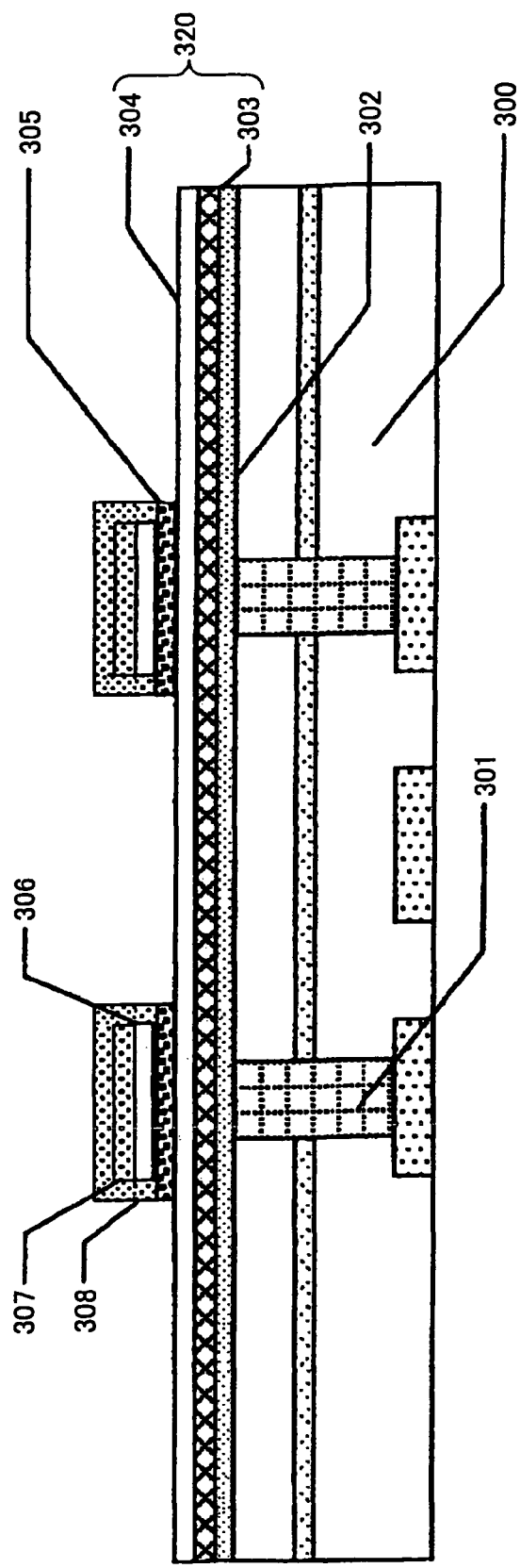
FIG. 35 shows the method of manufacturing the ferroelectric memory device according to the third embodiment.

(5-2) As shown in FIG. 35, the second hydrogen barrier film 308 and the ferroelectric film 305 are patterned to a desired shape. The patterning may be performed using a dry etching method by applying a lithographic technology. The second hydrogen barrier film 308 and the ferroelectric film 305 are formed to have a planar shape larger than that of the upper electrode 306 and the first hydrogen barrier film 307.

Figure 36:
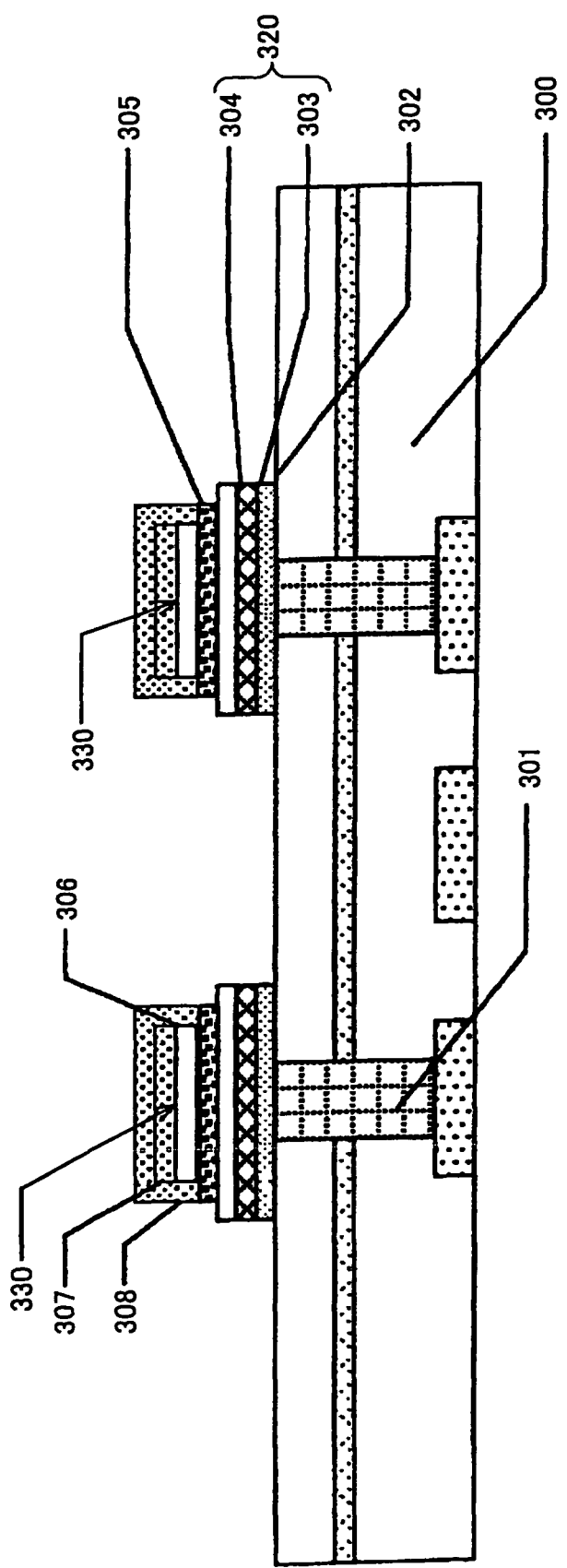
FIG. 36 shows the method of manufacturing the ferroelectric memory device according to the third embodiment.

(5-3) As shown in FIG. 36, the remaining lower electrode 320 and barrier metal layer 302 are patterned to form a ferroelectric capacitor 330.

The ferroelectric capacitor 330 is formed on the plug 301. The patterning may be performed using a dry etching method by applying a lithographic technology. The ferroelectric capacitor 330 is then subjected to an annealing treatment at 675° C. for five minutes in an oxygen atmosphere. The lower electrode 320 and the barrier metal layer 302 are formed to have a planar shape larger than that of the ferroelectric film 305.

Figure 37:
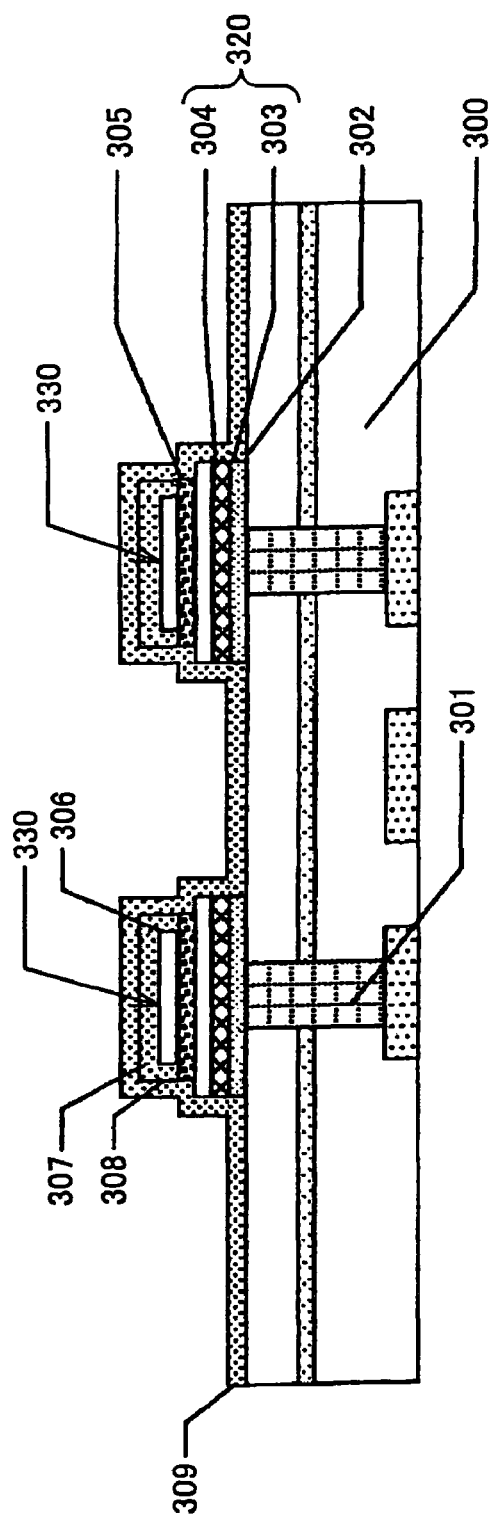
FIG. 37 shows the method of manufacturing the ferroelectric memory device according to the third embodiment.

(5-4) As shown in FIG. 37, the third hydrogen barrier film 309 is formed to cover the ferroelectric capacitor 330. The third hydrogen barrier film 309 is formed to have a tensile stress by arbitrarily adjusting the deposition conditions.

In more detail, the hydrogen barrier film 309 is formed to cover the first and second hydrogen barrier films 307 and 308 on the ferroelectric capacitor 330, the sidewall of the ferroelectric capacitor 330, and the substrate 300. Specifically, the first to third hydrogen barrier films 307, 308, and 309 are formed in layers on the ferroelectric capacitor 330 (upper electrode 306, for example), and only the third hydrogen barrier film 309 is formed on the sidewalls of the lower electrode 320 and the barrier metal layer 302. The second and third hydrogen barrier films 308 and 309 are formed on the sidewalls of the upper electrode 306 and the ferroelectric film 305. This enables the thickness of the hydrogen barrier film on the upper side of the ferroelectric capacitor 330 to be relatively greater than the thickness of the hydrogen barrier film on the sidewall of the ferroelectric capacitor 330.

As the material and the deposition method for the third hydrogen barrier film 309, the description for the first hydrogen barrier film 307 may be applied. The first to third hydrogen barrier films 307, 308, and 309 may be formed of the same material, or one of the first to third hydrogen barrier films 307, 308, and 309 may be formed of a different material, or the first to third hydrogen barrier films 307, 308, and 309 may be respectively formed of different materials. The first to third hydrogen barrier films 307, 308, and 309 may be formed by using the same deposition method (ALCVD method, for example), or one of the first to third hydrogen barrier films 307, 308, and 309 may be formed by using a different deposition method. As an example of the latter, the first hydrogen barrier film 307 may be formed by using a sputtering method, and the second and third hydrogen barrier films 308 and 309 may be formed by using an ALCVD method. As another example, the first and second hydrogen barrier films 307 and 308 may be formed by using a sputtering method, and the third hydrogen barrier film 309 may be formed by using an ALCVD method.

Figure 38:
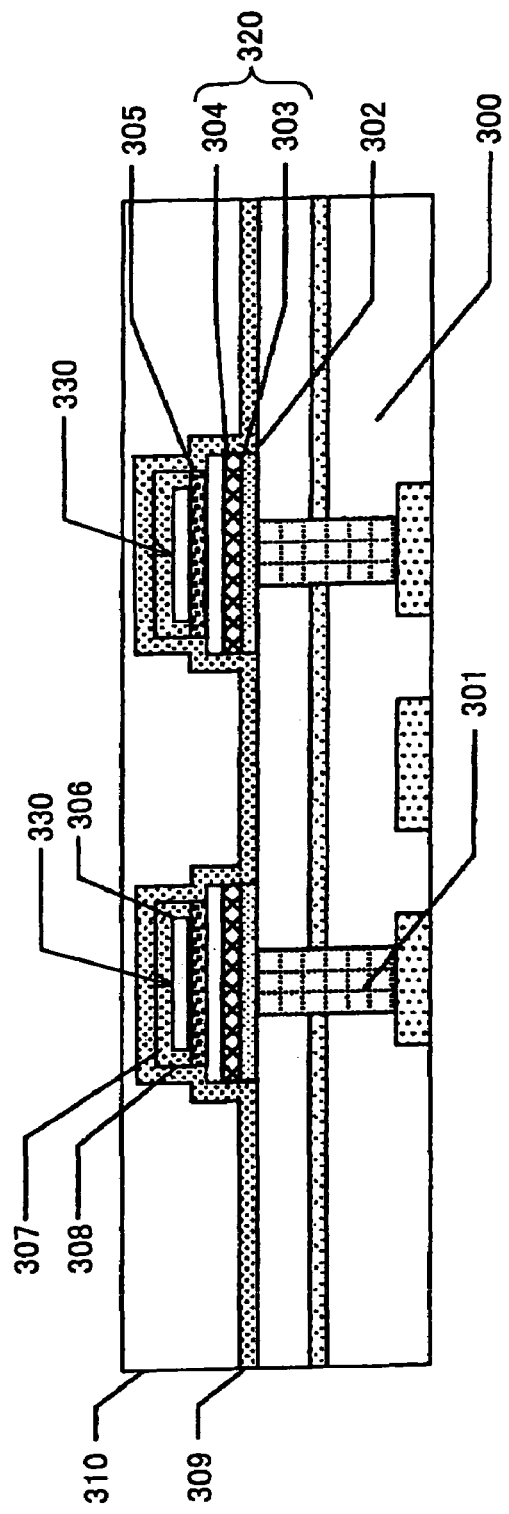
FIG. 38 shows the method of manufacturing the ferroelectric memory device according to the third embodiment.
Figure 39:
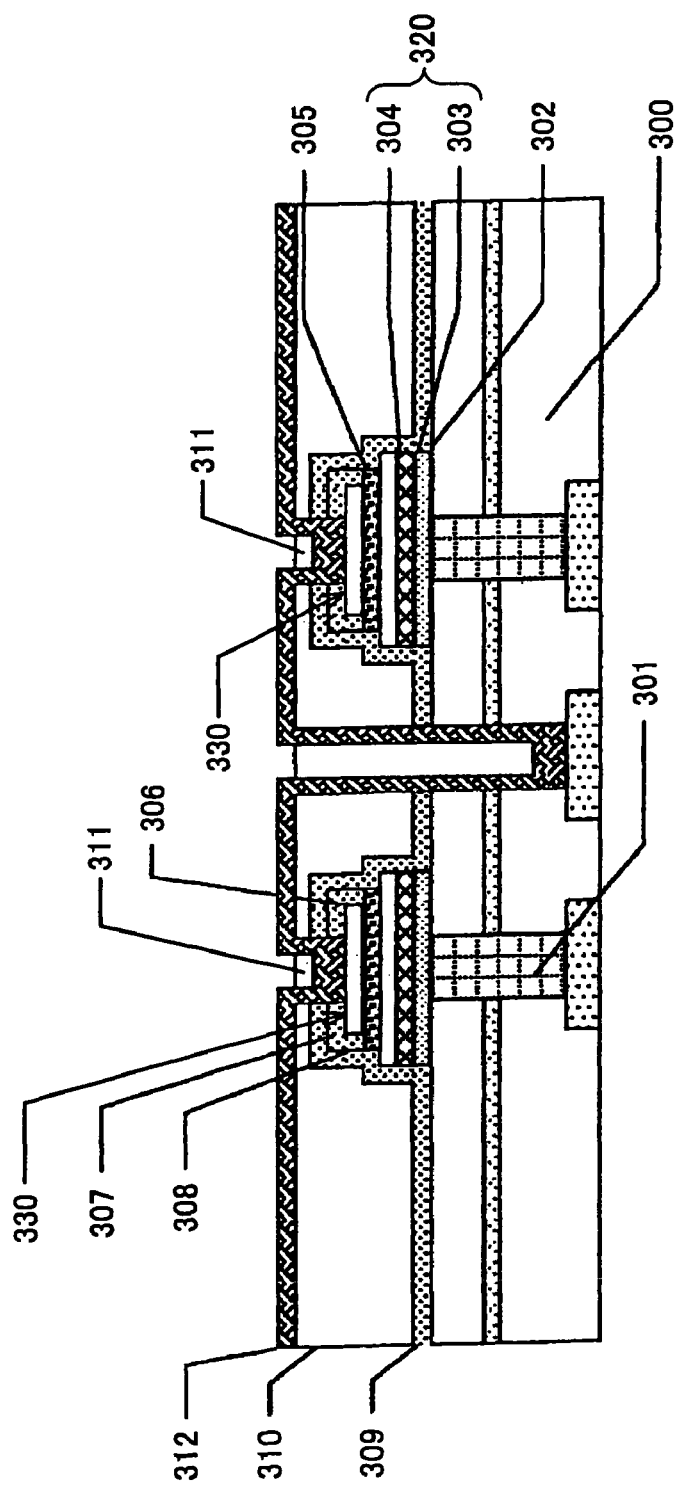
FIG. 39 shows the method of manufacturing the ferroelectric memory device according to the third embodiment.

(6) As shown in FIGS. 38 and 39, an interlayer dielectric 309 is formed, and a contact hole 311 is formed in the interlayer dielectric 309.

As the interlayer dielectric 310, a tetraethylorthosilicate (TEOS)-$SiO_2$ film may be deposited by using a plasma chemical vapor deposition method, for example. The contact hole 311 may be formed by using a dry etching method, for example. The substrate 300 is then heated in the same manner as described in the first embodiment.

Figure 40:
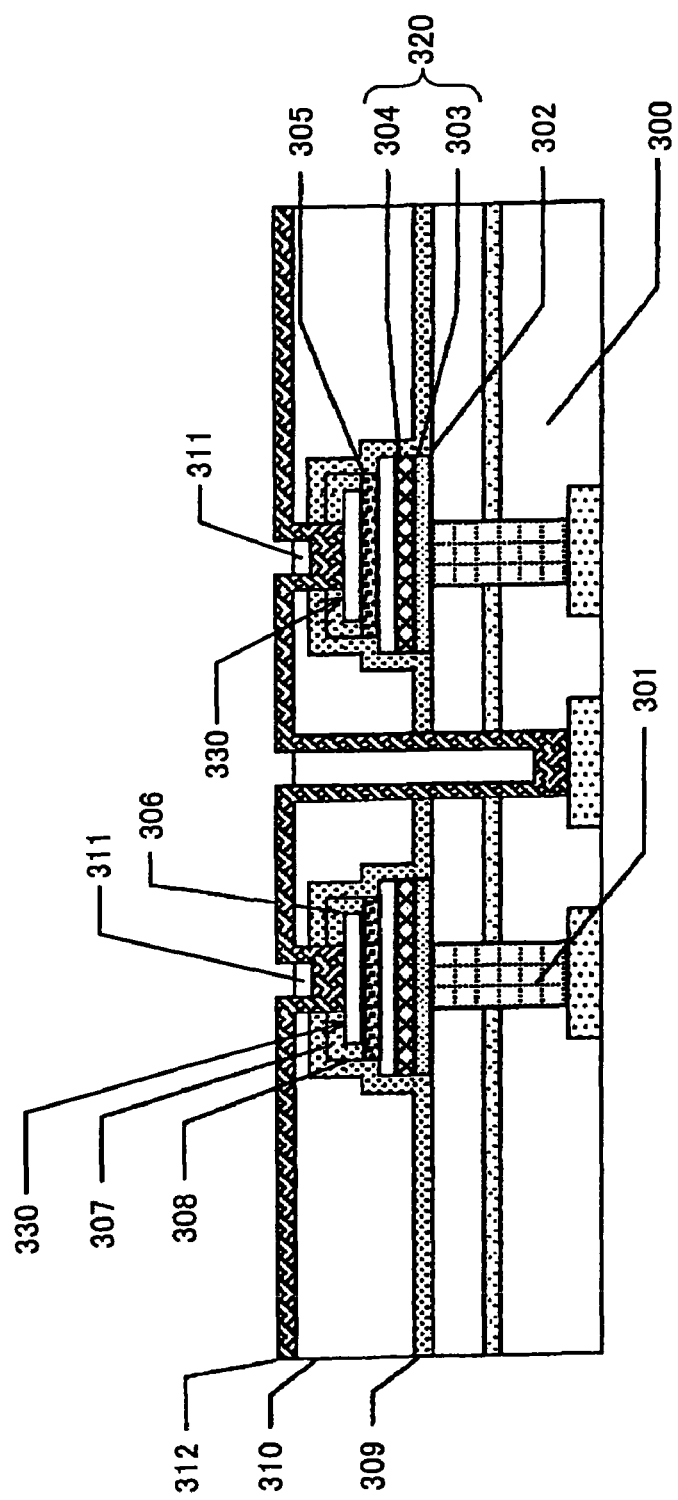
FIG. 40 shows the method of manufacturing the ferroelectric memory device according to the third embodiment.
Figure 41:
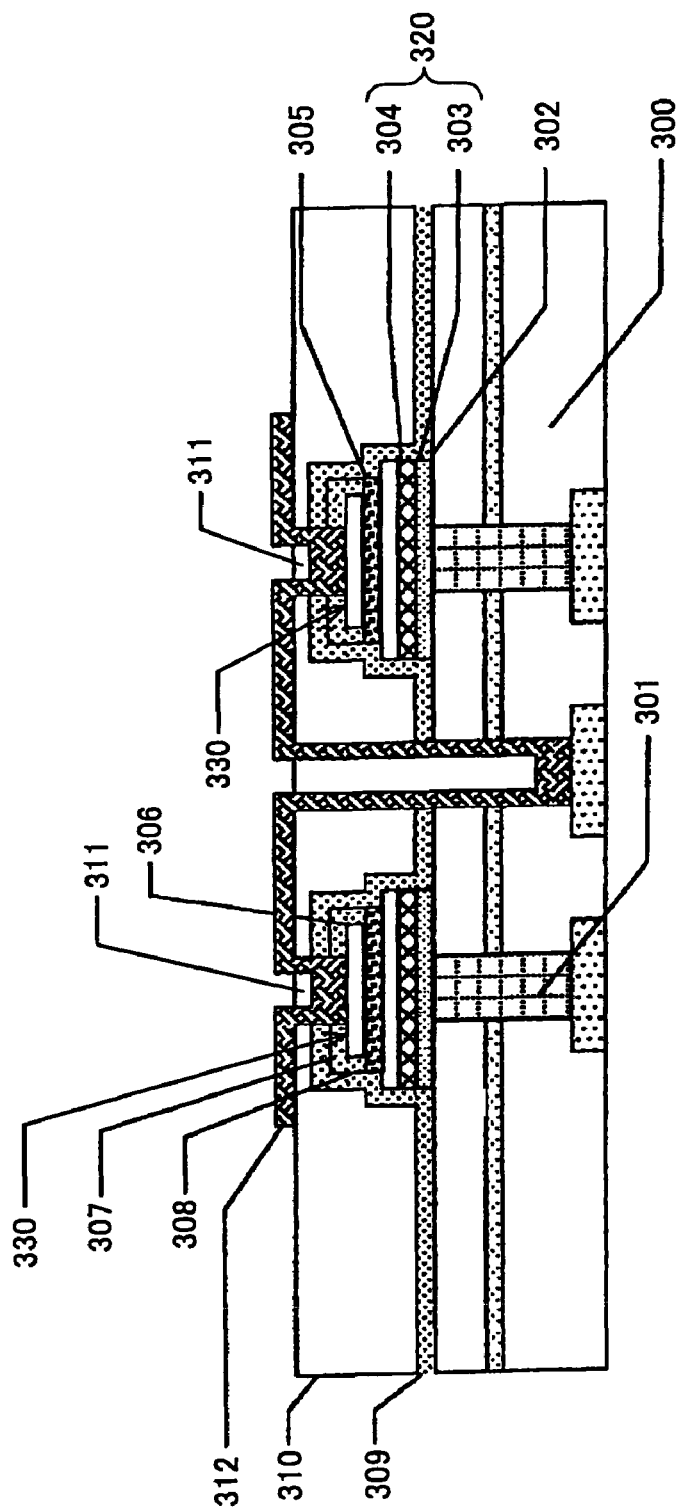
FIG. 41 shows the ferroelectric memory device according to the third embodiment and the method of manufacturing the same.

(7) As shown in FIGS. 40 and 41, a conductive film 312 is formed in the region including the inner surface of the contact hole 311. The conductive film 312 is deposited by using a sputtering method, and is then patterned. The material for the conductive film 312 is not limited insofar as the material exhibits conductivity, and the description for the first embodiment may be applied.

A ferroelectric memory device including the ferroelectric capacitor 330 can be manufactured in this manner. The ferroelectric memory device includes the substrate 300, the plug 301, the ferroelectric capacitor 330, and the first to third hydrogen barrier films 307, 308, and 309. The planar shape of the upper electrode 306 is smaller than the planar shape of the ferroelectric film 305. The planar shape of the ferroelectric film 305 is smaller than the planar shape of the lower electrode 320. The hydrogen barrier film (first to third hydrogen barrier films 307, 308, and 309) is formed so that the thickness of the area provided on the upper electrode 306 is greater (about twice or four times, for example) than the thickness of the area provided on the sidewall of the ferroelectric capacitor 330.

Examples of this embodiment are described below.

3.1 Sample

A ferroelectric memory device obtained by the above-described manufacturing method is referred to as a sample 5. In more detail, an $AlO_x$ film was deposited as the first hydrogen barrier film 307 to a thickness of 60 nm by using an ALCVD method, an $AlO_x$ film was deposited as the second hydrogen barrier film 308 to a thickness of 10 nm by using an ALCVD method, and an $AlO_x$ film was deposited as the third hydrogen barrier film 309 to a thickness of 10 nm by using an ALCVD method. As the details of the ALCVD deposition conditions, the description of Example 1 may be applied.

A sample 6 was formed for comparison by using a conventional method. Specifically, the formation of the first and second hydrogen barrier films 307 and 308 in the manufacturing steps of the sample 6 was omitted, and only a hydrogen barrier film corresponding to the third hydrogen barrier film 309 in the sample 5 was deposited to a thickness of 80 nm by using an ALCVD method. The resulting sample 6 had the same device structure as that of the sample 5 except that the first hydrogen barrier film 307 and the second hydrogen barrier film 308 were not formed.

3.2 Characteristic Evaluation

The characteristics of the memory devices obtained by each manufacturing method were compared. In this characteristic evaluation, attention was directed to the ferroelectric characteristics of the ferroelectric thin-film capacitor. When an appropriate alternating voltage is applied between the upper and lower electrodes, a certain amount of electric charge occurs on the upper and lower electrodes depending on the amount and the direction of the applied voltage. The applied voltage and the amount of electric charge are respectively plotted on the horizontal axis and the vertical axis in order to monitor this state to obtain a hysteresis loop specific to the ferroelectric caused by polarization reversal. The polarization at a voltage of zero is called a remanent polarization. The greater the remanent polarization, the greater the amount of electric charge (signal), and the more advantageous for reading.

Figure 42:
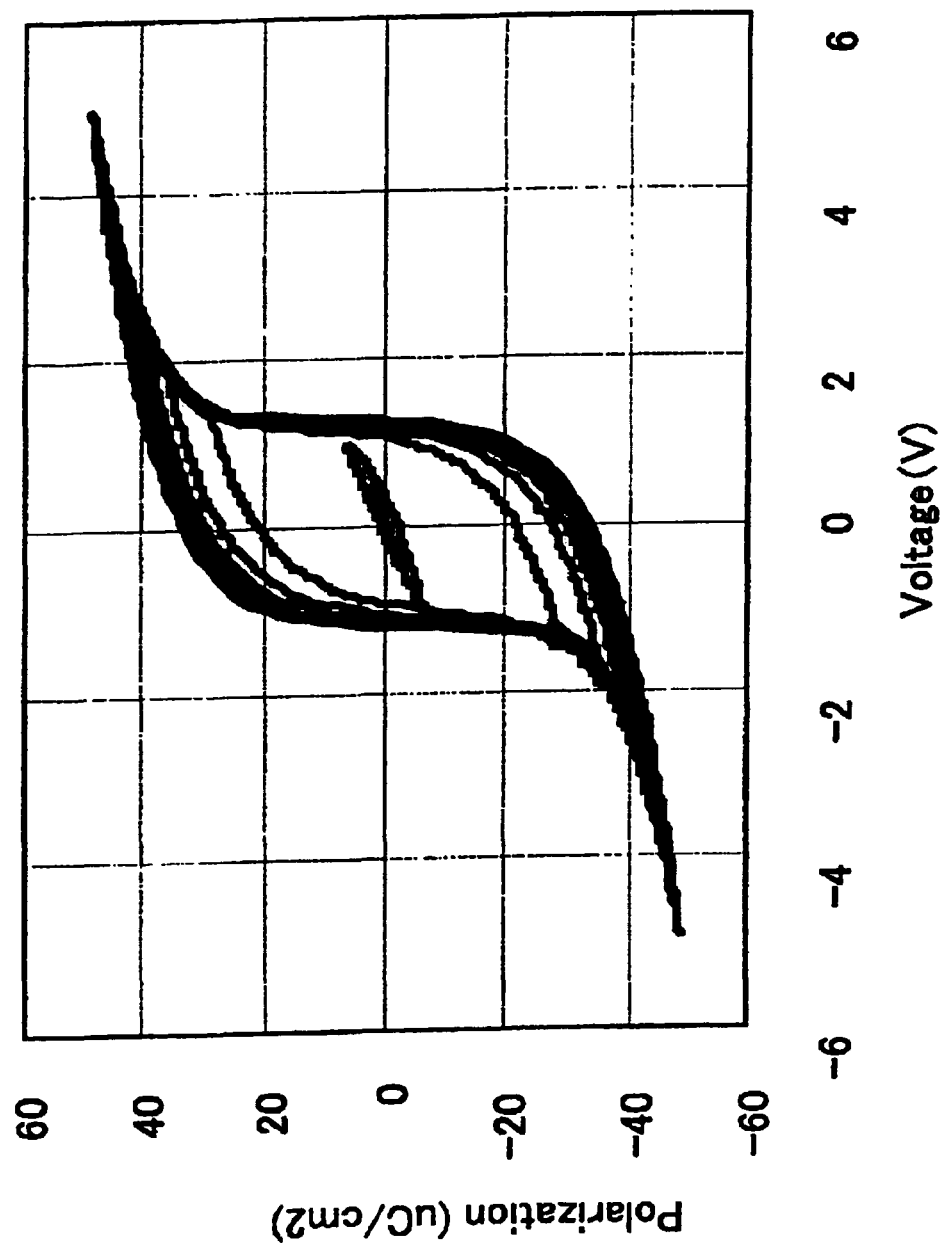
FIG. 42 is a graph showing the hysteresis loop of a sample 5 according to Example 3.
Figure 43:
FIG. 43 is a graph showing the hysteresis loop of a sample 6 according to Example 3.

FIG. 42 shows the hysteresis loop of the ferroelectric capacitor in the sample 5 according to this example, and FIG. 43 shows the hysteresis loop of the ferroelectric capacitor in the sample 6 according to the conventional example.

As is clear from each drawing, while a hysteresis loop having an excellent squareness and a large remanent polarization was obtained for the sample 5, the sample 6 shows a deformed hysteresis loop and has a small remanent polarization. It was confirmed that a large difference in the capacitor characteristics occurs after interconnection due to the difference in the device formation process between the sample 5 and the sample 6.

It is considered that the ferroelectric characteristics of the sample 6 deteriorate to a large extent due to hydrogen damage caused by ashing of the resist mask after etching of the ferroelectric capacitor and deposition of the $TEOS-SiO_2$ film as the interlayer dielectric. The details are the same as described in Example 2.

In this example, when forming the ferroelectric capacitor, the upper electrode 306 is formed in the first patterning step, the ferroelectric film 305 is formed in the second patterning step, and the lower electrode 320 and the barrier metal layer 302 are formed in the third patterning step. Specifically, the sample 5 is subjected to three stages of etching in the order from the first to third patterning steps. In the first patterning step, the first hydrogen barrier film 307 is formed in advance on the upper electrode 306 before patterning the upper electrode 306. Therefore, in the resist ashing step after patterning the upper electrode 306, hydrogen can be prevented from entering the upper electrode 306. In the second patterning step, the second hydrogen barrier film 307 is formed in advance on the ferroelectric film 305 before patterning the ferroelectric film 305. Therefore, in the resist ashing step after patterning the ferroelectric film 305, hydrogen can be prevented from reaching the interface between the ferroelectric film 305 and the upper electrode 306. In the third patterning step, the third hydrogen barrier film 309 is formed in advance on the lower electrode 320 before patterning the lower electrode 320 and the barrier metal layer 302. Therefore, in the resist ashing step after patterning the lower electrode 320 and the barrier metal layer 302, since a plurality of hydrogen barrier films have been formed on the upper electrode 306 and the ferroelectric film 305, hydrogen does not reach the interface between the upper electrode 306 and the ferroelectric film 305. Since the hydrogen barrier film (first to third hydrogen barrier film 307, 308, and 309) thicker than that of the sample 6 has been formed on the upper electrode 306 of the ferroelectric capacitor 330 in the stage of depositing the interlayer dielectric 310, hydrogen can be completely prevented from entering the ferroelectric film 305 from the upper electrode 306. As a result, as shown in FIG. 42, excellent ferroelectric characteristics free from hydrogen damage can be obtained.

4.1 Sample

In the sample 5 of Example 3, the first hydrogen barrier film 307, the second hydrogen barrier film 308, and the third hydrogen barrier film 309 were formed by using an ALCVD method. Trimethylaluminum (TMA) was used as the raw material, and ozone was used as the oxidizing agent.

A sample 7 for comparison was formed by using water ($H_2O$) as the oxidizing agent instead of ozone. The remaining conditions were the same as those for the sample 5.

4.2 Characteristic Evaluation

Figure 44:
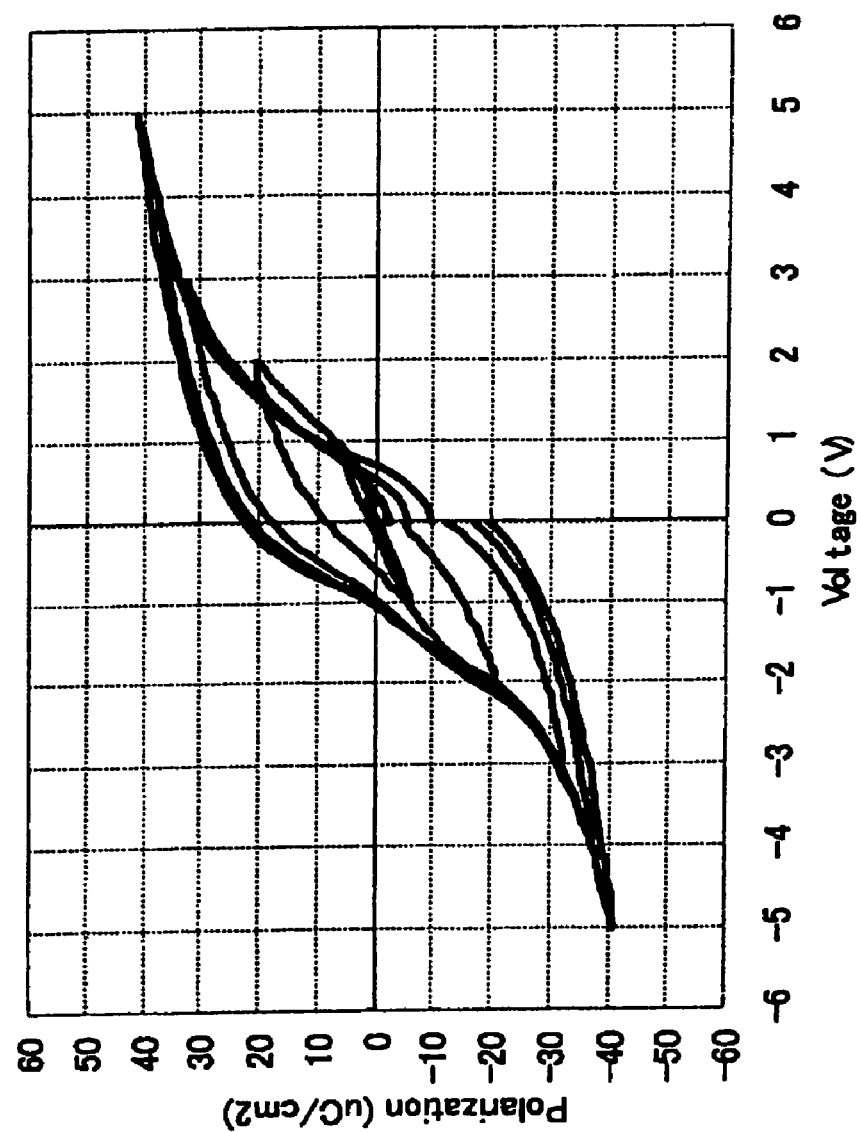
FIG. 44 is a graph showing the hysteresis loop of a sample 7 according to Example 4.

The hysteresis loop was measured in order to examine the ferroelectric characteristics of the sample 7 to obtain the result as shown in FIG. 44. As is clear from the comparison with FIG. 42, the sample 7 exhibits poor characteristics. Although both water and ozone function as the oxidizing agent for TMA, a large difference in the capacitor characteristics occurred due to the difference in the oxidizing agent.

When water molecules are supplied in a state in which TMA is adsorbed on the surface of the substrate, the methyl group ($CH_3$) bonded to the aluminium atom reacts with the water molecule and exchanges the ligand to form an OH group. After all the methyl groups on the surface have reacted and become saturated, the unreacted water molecules remain in the film as excess molecules and are diffused toward the PZT capacitor. It is known that $H_2O$ penetrating the ferroelectric (PZT) impairs the insulating characteristics and the ferroelectric characteristics of the ferroelectric. In this example, since the water molecules are supplied during the $AlO_x$ deposition process in an amount equal to or greater than the amount necessary for oxidizing TMA, it is considered that deterioration of the characteristics of the PZT capacitor (deterioration of crystallinity) occurred due to the water molecules incorporated into PZT.

The following reaction occurs when ozone is used to oxidize TMA as in the case of the sample 5 of Example 3. When ozone is supplied in a state in which TMA is adsorbed on the substrate, the methyl group bonded to the aluminium atom is decomposed into carbon dioxide ($CO_2$) and water ($H_2O$) due to a complete combustion reaction. The water molecule among these by-products acts on the unreacted methyl group to form an OH group in the same manner as described above. Since the water molecules produced during the reaction process are consumed by the ligand replacement reaction of TMA, it is considered that the amount of the water molecules remaining in the $AlO_x$ film is significantly small or the water molecules rarely exist in the $AlO_x$ film. It is considered that this prevents deterioration of the characteristics of the PZT capacitor differing from this example. It was confirmed that use of ozone as the oxidizing agent for TMA is extremely effective for maintaining the characteristics of the ferroelectric capacitor.

Although only some embodiments of the present invention have been described in detail above, those skilled in the art will readily appreciate that many modifications are possible in the embodiments without materially departing from the novel teachings and advantages of this invention. Accordingly, all such modifications are intended to be included within scope of this invention.

What is claimed is:

1. A method of manufacturing a ferroelectric memory device, the method comprising:
   (a) forming a lower electrode, a ferroelectric film, and an upper electrode on a substrate in layers in that order;
   (b) forming a first hydrogen barrier film on an upper surface of the upper electrode;
   (c) patterning the first hydrogen barrier film, the upper electrode, the ferroelectric film, and the lower electrode to form a ferroelectric capacitor; and
   (d) forming a second hydrogen barrier film to directly contact an upper surface of the first hydrogen film, directly contact a side surface of the first hydrogen film, directly contact a side surface of the upper electrode, directly contact a side surface of the ferroelectric film and directly contact a side surface of the lower electrode.

2. The method of manufacturing a ferroelectric memory device as defined in claim 1,
   wherein the first hydrogen barrier film is formed by using the same method as the upper electrode.

3. The method of manufacturing a ferroelectric memory device as defined in claim 1,
   wherein at least one of the first and second hydrogen barrier films is formed by using an atomic-layer CVD (AL-CVD) method.

4. The method of manufacturing a ferroelectric memory device as defined in claim 3,
   wherein ozone is used as an oxidizing agent for a metal element to be supplied in the ALCVD method.

\* \* \* \* \*